(12) United States Patent
Kim et al.

(10) Patent No.: US 11,587,603 B2
(45) Date of Patent: Feb. 21, 2023

(54) LOCAL REFERENCE VOLTAGE GENERATOR FOR NON-VOLATILE MEMORY

(71) Applicant: Infineon Technologies LLC, San Jose, CA (US)

(72) Inventors: Edwin Kim, Colorado Springs, CO (US); Alan DeVilbiss, Colorado Springs, CO (US); Kapil Jain, Colorado Springs, CO (US); Patrick O'Connell, Colorado Springs, CO (US); Franklin Brodsky, Colorado Springs, CO (US); Shan Sun, Monument, CO (US); Fan Chu, Colorado Springs, CO (US)

(73) Assignee: INFINEON TECHNOLOGIES LLC, San Jose, CA (US)

( * ) Notice: Subject to any disclaimer, the term of this patent is extended or adjusted under 35 U.S.C. 154(b) by 0 days.

(21) Appl. No.: 17/122,284

(22) Filed: Dec. 15, 2020

(65) Prior Publication Data
US 2022/0101904 A1 Mar. 31, 2022

Related U.S. Application Data

(60) Provisional application No. 63/085,823, filed on Sep. 30, 2020.

(51) Int. Cl.
*G11C 11/22* (2006.01)
(52) U.S. Cl.
CPC ........ *G11C 11/2257* (2013.01); *G11C 11/221* (2013.01); *G11C 11/2255* (2013.01); *G11C 11/2273* (2013.01); *G11C 11/2297* (2013.01)

(58) Field of Classification Search
CPC ... G11C 11/22; G11C 11/2257; G11C 11/221; G11C 11/2273; G11C 11/2255
See application file for complete search history.

(56) References Cited

U.S. PATENT DOCUMENTS 6,128,213 A * 10/2000 Kang ................. G11C 8/08
365/145
9,514,797 B1 12/2016 Chu et al.
(Continued)

OTHER PUBLICATIONS

International Search Report and Written Opinion for International Application No. PCT/US21/52784, dated Dec. 28, 2021; 10 pages.

*Primary Examiner* — Han Yang

(57) ABSTRACT

A memory device including a reference voltage ($V_{REF}$) generator and method for operating the same to improve memory sensing margin, and extend operational temperature range and life of the device are disclosed. Generally, the device further includes an array of non-volatile memory cells divided into a plurality of blocks, a sensing circuit coupled to the array to receive and compare memory signals therefrom to the $V_{REF}$ to read data from the cells. The Local reference voltage generator is configured to provide one of a number of reference voltages to the sensing circuit based on which of the blocks is being read. The array can be divided based on row and column addresses of cells in the blocks. Where the cells include 1T1C ferroelectric random access memory (F-RAM) cells, and the reference voltages are selected based on a lowest P-term or highest U-term of the cells in the block being read.

14 Claims, 15 Drawing Sheets

(56) References Cited

U.S. PATENT DOCUMENTS

| | | |
|---|---|---|
| 2003/0095435 A1 | 5/2003 | Kato et al. |
| 2007/0153575 A1 | 7/2007 | Cohen |
| 2014/0177345 A1* | 6/2014 | Yamazaki ........... G11C 11/4076 365/189.03 |
| 2016/0240238 A1 | 8/2016 | Zhou et al. |
| 2016/0240250 A1* | 8/2016 | Oh ....................... G06F 11/1048 |
| 2019/0027202 A1* | 1/2019 | Bedeschi ............ G11C 11/2273 |
| 2020/0152287 A1* | 5/2020 | Kim .................... G11C 11/4099 |

* cited by examiner

|  | Segment | | | |
|---|---|---|---|---|
| Logical Section | 0 | 1 | 2 | 3 |
| 3 | 502 | | | |
| 3 | | | | |
| 2 | | 504 | | |
| 2 | | | | |
| 1 | | | | |
| 1 | | | | |
| 0 | | | | |
| 0 | | | | |

*FIG. 5*

LOCAL REFERENCE VOLTAGE GENERATOR FOR NON-VOLATILE MEMORY

CROSS-REFERENCE TO RELATED APPLICATIONS

This application claims the benefit of priority under 35 U.S.C. 119(e) to U.S. Provisional Patent Application Ser. No. 63/085,823, filed Sep. 30, 2020, which is incorporated by reference herein in its entirety.

TECHNICAL FIELD

This disclosure relates generally to semiconductor memories, and more particularly to a memory device with an array of non-volatile memory (NVM) cells divided into segments or blocks and including a local reference voltage generator, and methods of operating the same.

BACKGROUND

Integral Memory devices using an array of non-volatile memory (NVM) cells adopting single-ended sensing, such as a 1T1C (1 Transistor 1 Capacitor) architecture, provide high memory densities. An NVM memory cell stores data either as a charge, such as in silicon-oxide-nitride-oxide-silicon (SONOS) type charge-trapping NVM cells, or as a polarization state of a ferroelectric capacitor in a ferroelectric random access memory (F-RAM) cell. In single-ended sensing/read, data stored in the cell is read by comparing a reference voltage to a voltage developed on a bitline of the cell due to the charge or polarization state of the cell. Based on the comparison result of the bitline voltage or current to the reference, the NVM cell is considered either programmed or erased. For example, a 1T1C F-RAM cell is shown in FIG. 1. The cell 100 includes a ferroelectric capacitor 102 having a first plate connected to a plateline (PL) and a second plate coupled to a bitline (BL) through a transistor 104 controlled be a wordline (WL). Data is written to the cell by applying an electric field by charging plates on either side of ferroelectric capacitor 102, forcing atoms inside the ferroelectric capacitor into the up or down orientation (depending on the polarity of the charge), thereby storing a P-term or a logical '1,' or a U-term or logical '0.' In another embodiment, logical/binary states of "P-term" and "U-term" may be revered. In single-ended sensing, the cell 100 is read by applying a read voltage between the plateline PL and bitline BL, or pulsing the plateline, and operating the transistor 104. A "P-term" or "U-term" voltage will be outputted via the bitline BL, which is then compared to a reference voltage ($V_{REF}$) using a sense amplifier 106 in the memory device.

The reference voltage ($V_{REF}$) is developed by performing a margin sweep of an array of memory cells to determine the expected bitline voltage from reading programmed cells (P-terms) and erased cells (U-terms). In one embodiment, $V_{REF}$ may be selected to lie between a highest measured U-term (U0) voltage and a lowest measured P-term (P0) voltage of the entire memory array so that when the memory cell 100 is read, the resulting bitline voltages above the reference are recognized as programmed and voltages below as erased. FIG. 1 shows an example margin sweep of an F-RAM memory array showing statistical variation of bitline voltage (memory signal) from reading P-terms and U-terms. The difference between the lowest P-term (P0) and highest U-term (U0) represents the overall sensing margin (U-margin+P-margin).

FIG. 2 is a plot illustrating margin sweep of memory signal from memory cells in an F-RAM array showing statistical variations in P-terms and U-terms voltages (bitline voltages) for different cells in an array of cells in a NVM and an effect on overall sensing margin for the NVM. Referring to FIG. 2 it is seen one problem with conventional NVM devices adopting single-ended sensing using a global $V_{REF}$ applied through a reference bitline (Ref. BL) to all or a number of cells in the device, such as an array of 1T1C F-RAM cells, is statistical variations of P-term and U-term values for individual cells. In FIG. 2 each black dot between 0 and about 55 millivolts (mV) represents the unprogrammed or U-term for one cell. The U margin 202 for the NVM device represents the difference in voltage between $V_{REF}$ and a highest or worst case U-term (U0) for one or more cells in the NVM device. Similarly, each black dot between about 180 and 200 mV represents the programed or P-term for one cell. The P margin 204 for the NVM device represents the difference in voltage between $V_{REF}$ and a lowest or worst case P-term (P0) for cells in the NVM device. These statistical variations are particularly problematic for the P-Margin, as retention loss and other time dependent factors are observed to cause more degradation of the P-term (P0 shifts downward) than for the U-terms.

A further problem with memory devices using an array of 1T1C cells in an F-RAM array arises from a temperature dependence of the P-terms and U-terms. FIG. 3 is a graph showing the temperature dependence of P-terms and U-terms of memory cells where $V_{REF}$ is set at 21 mV above the worst case U-term (U0) or about 83 mV. Referring to FIG. 3, it is seen that a P-margin (the difference between the worst case P-term (P0 302) and $V_{REF}$) decreases as the temperature of the NVM device increases. For example, at 0° C. the NVM device has a P-margin of about 57 mV, while at about 125° C. the P-margin has dropped to about 22 mV. Exacerbating this temperature dependence is a time dependent degradation in which the temperature dependent P0 302 shifts over a lifetime of the NVM device from an initial, higher voltage to a lower voltage. This time dependent degradation at a particular temperature is represented in FIG. 3 by vertical bars 302. For example, the lifetime of the NVM device the P0 302 at 0° C. can decrease from a high of about 155 mV to about 128 mV or from a P-margin of about 72 mV to about 45 mV. This time dependent degradation combined with temperature dependence can cause the P-margin go to effectively zero at higher operating temperatures leading to an early end-of-life. End-of-life occurs when there is no longer a sufficient P-margin between P0 302 at the highest expected operating temperature and $V_{REF}$ for the state of the memory cell to be reliably determined by a read operation.

Referring again to FIG. 3 it is noted that a worst case or highest U-term (U0 306) is also subject to temperature dependence and time dependent degradation. However, both factors have been observed to cause less degradation of the U-terms (U0 306) than for the P-terms (P0 302).

Finally, it will be understood that since the range of P-term and U-term values for individual cells is the result of statistical variation, and that because it is expected that there will be greater observed variation for larger arrays, reduced margins of the worst-case memory cells will limit a size of the array if a single global $V_{REF}$ is adopted for the entire array.

Accordingly, there is a need for a memory device including an array of 1T1C NVM cells and methods of operating the same, to optimize margins between a $V_{REF}$, and P-terms and U-terms to enable memory devices having larger arrays, improve reliability and yield, and to extend an operating life of the device.

SUMMARY

A memory device or system including an array of cells divided into segments or blocks, and a reference voltage generator capable of providing local reference voltages for reading different blocks and method for operating the same are disclosed. Generally, the device includes in addition to the reference voltage generator and array of non-volatile memory (NVM) cells divided into multiple blocks, a sensing circuit coupled to the array to receive and compare memory signals therefrom to the local reference voltage to read data from the cells. The reference voltage generator is configured to provide one of a number of reference voltages to the sensing circuit based on which of the blocks is being read. Where the NVM cells are arranged in multiple rows each sharing a wordline and plateline, and multiple columns each sharing a bitline, and the array is logically divided into multiple blocks based on row and column addresses of NVM cells in each of blocks, and the reference voltage generator is configured to provide one of the number of reference voltages to the sensing circuit based on the row and column addresses of NVM cells in the multiple blocks.

Methods of operating a memory device including an array of memory cells divided into multiple blocks and a reference voltage generator capable of providing optimized, local reference voltages to each block are also disclosed. Generally, the method begins with logically dividing an array of memory cells in the memory device into multiple blocks based on row and column addresses of cells in each block. Next, a number of margin sweeps are performed for each block to determine an optimized, local reference voltage for each block. From the local reference voltages for each block a base reference voltage for the array and an adjustment reference voltage for each block, the adjustment reference voltage being that voltage by which the base reference can be offset to provide the local reference voltages for each block. The adjustment reference voltage for each block are stored in a lookup table coupled to the memory device or reference voltage generator. During a read operation of memory cells in one of the multiple blocks a final or local reference voltage, substantially equal to the optimized, local reference voltage that block, is generated by looking up the adjustment reference voltage for the block and combining it with the base reference voltage. This local reference voltage is applied to a reference bitline input of a sense-amplifier coupled to a bitline of the memory cells being read.

The reference voltage generator and method of the present disclosure is particularly useful where the array includes one-transistor, one-capacitor (1T1C) ferroelectric random access memory (F-RAM) cells, and the reference voltage used to read one of the blocks is selected based on a lowest P-term (P0) or highest U-term (U0) of the F-RAM cells in the block being read.

BRIEF DESCRIPTION OF DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

FIG. 5 is a block diagram of a memory array divided up into a number of blocks for which address-dependent reference voltages are generated;

DETAILED DESCRIPTION

A memory device or system including an array of cells divided into segments or blocks, and a reference voltage generator capable of providing local reference voltages for reading different blocks and method for operating the same are provided. The memory device and methods improve yield, reliability and extend operating life and temperature ranges of the device, and are particularly useful in or with non-volatile memories (NVM) adopting single-ended sensing, such as 1T1C ferroelectric random access memory (F-RAM).

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to one embodiment or an embodiment means that a particular feature, structure, or characteristic described in connection with the embodiment is included in at least one embodiment of the invention. The appearances of the phrase in one embodiment in various places in the specification do not necessarily all refer to the same embodiment. The term to couple as used herein may include both to directly electrically connect two or more components or elements and to indirectly connect through one or more intervening components.

Briefly, a memory device includes an array of non-volatile memory (NVM) cells divided into multiple blocks, a sensing circuit coupled to the array to receive memory signals therefrom and to compare the memory signals to reference voltages to read data from the NVM cells. The memory device further includes or is coupled to a reference voltage generator to provide reference voltages the sensing circuit. The reference voltage generator is configured to provide one of a number of reference voltages to the sensing circuit based on which one of the blocks is being read. The block being read can be identified by an address or address of the NVM cell(s) being read.

Figure 4:
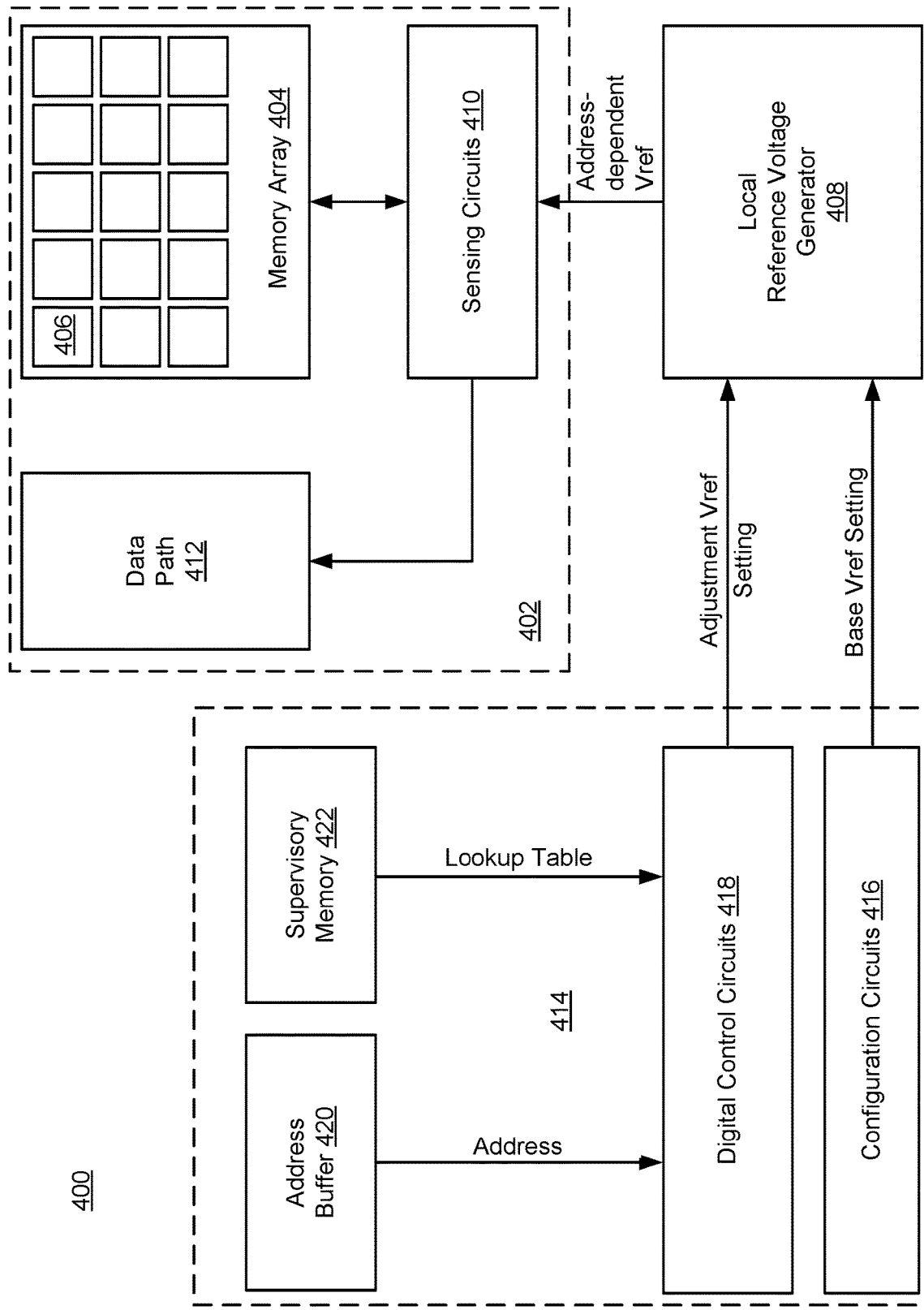
FIG. 4 is a block diagram of a system including a memory array and an address-dependent, local reference voltage generator.

A block diagram of a system 400 including a memory device 402 having a memory array 404 divided into multiple segments or blocks 406, and an address-dependent local reference voltage ($V_{REF}$) generator 408 is shown in FIG. 4. Referring to FIG. 4, in the embodiment shown the memory device 402 further includes a number of sensing circuits 410 coupled between the memory array 404 and the local reference voltage generator 408. The sensing circuits 410 receive an address-dependent local reference voltage from the local reference voltage generator 408, determine a binary or logic state (i.e. programmed or erased) of the memory cells in the block 406 being read, output data read through an interface or data path 412. In one embodiment, the memory array 404 may include 1T1C FRAM cells, wherein the P-term or U-term voltages of the FRAM cells are compared to the local reference voltage provided by the local reference voltage generator 408 to determine their binary state—programmed with a logic 1 or not. In other embodiments, memory device may include other types of NVM cells adopting a single-ended sensing configuration, such as charge-trapping silicon-oxide-nitride-oxide-silicon (SONOS) type cells, floating gate cells, R-RAM cells, M-RAM cells, etc.

The system 400 further includes reference voltage selection circuitry 414 for operating or controlling the local reference voltage generator 408 to provide address-dependent reference voltages, which are optimized for the block 406 being read. In the embodiment shown these circuits include configuration circuits 416 to provide base reference voltage ($V_{REF}$) settings to the local reference voltage generator 408, which are common or substantially the same for all the blocks 406 in the memory array 404, and digital control circuits 418 to provide adjustment reference $V_{REF}$ to the local reference voltage generator. The adjustment $V_{REF}$ settings enable the local reference voltage generator 408 to generate an adjustment reference voltage that is combined with or used to offset a base reference voltage to generate an address-dependent reference voltage optimized for the particular block 406 being read, in manner described in greater detail below.

Generally, as in the embodiment shown the system 400 also includes an address buffer 420, and a nonvolatile, supervisory memory 422 coupled to the digital control circuits 418. The address buffer 420 receives and communicates to the digital control circuits 418 addresses of the NVM cell(s) being read to enable digital control circuits to identify the block 406 (where the requested NVM cell(s) located) being read. The supervisory memory 422 includes one or more lookup tables storing information used by the digital control circuits 418 to generate the adjustment reference voltage settings.

Although the circuits and elements of the system 400 in FIG. 4 and described above are shown as separate blocks, it will be understood that each of these circuits and elements, including the memory device 402, can be integrally formed on a single, semiconductor substrate or chip, or packaged in a single multi-chip package, along with other elements of the memory device or system that are not shown, and that the system can be synonymous with the memory device.

The circuits and elements of the system 400 in FIG. 4, and the operation thereof will now be described in greater detail with reference to FIGS. 5 through 9.

Figure 5:
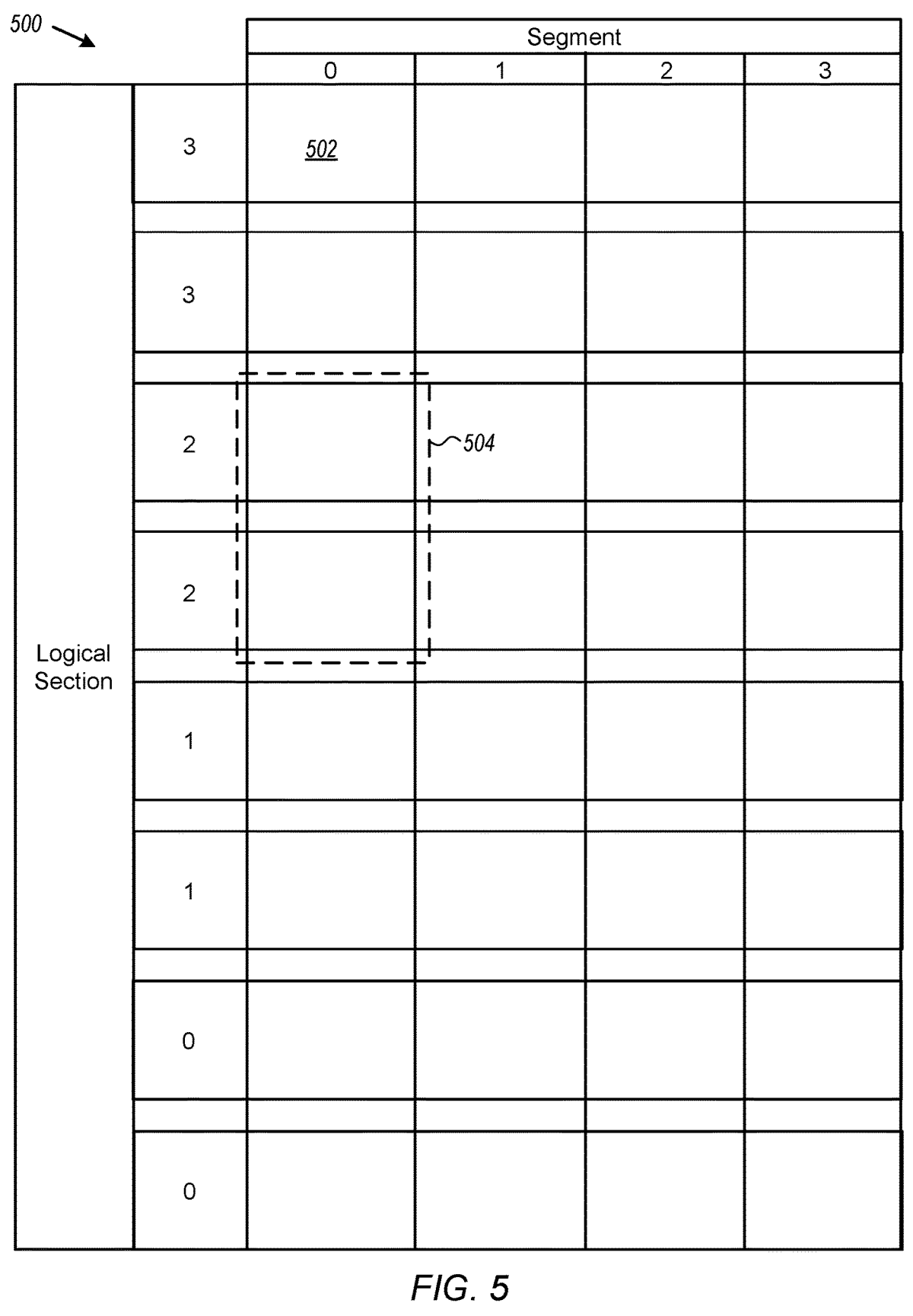

FIG. 5 is a block diagram of a memory array 500 divided up into a number of segments or blocks 502 for which address-dependent reference voltages are provided. Each segment or block 502 can be addressed by column and row address decoders in the memory device (not shown), and is identified or defined by a range of column and row addresses of memory cells in the memory array 500. For example, the memory array 500 can include a 4 Mb memory array that is divided up into sixteen (16) 256 Kb sub-arrays 504, each sub-array including one or more blocks 502. Margin sweeps are performed on each block 502 and optimized, local reference voltages are determined for each, individually. From these local reference voltages, a base reference voltages is determined for the entire memory array 500 or all blocks 502 in the memory array 500, along with proper adjustment reference voltages for each block 502.

Additionally or alternatively, the memory array 500 can be divided physically (as opposed to logically) into a number of physically separate, blocks 502 in which each individual block is provided with a local reference voltage from one of a number of local reference voltage generators coupled to one or a small number of the separate, smaller blocks 502.

Figure 6A:
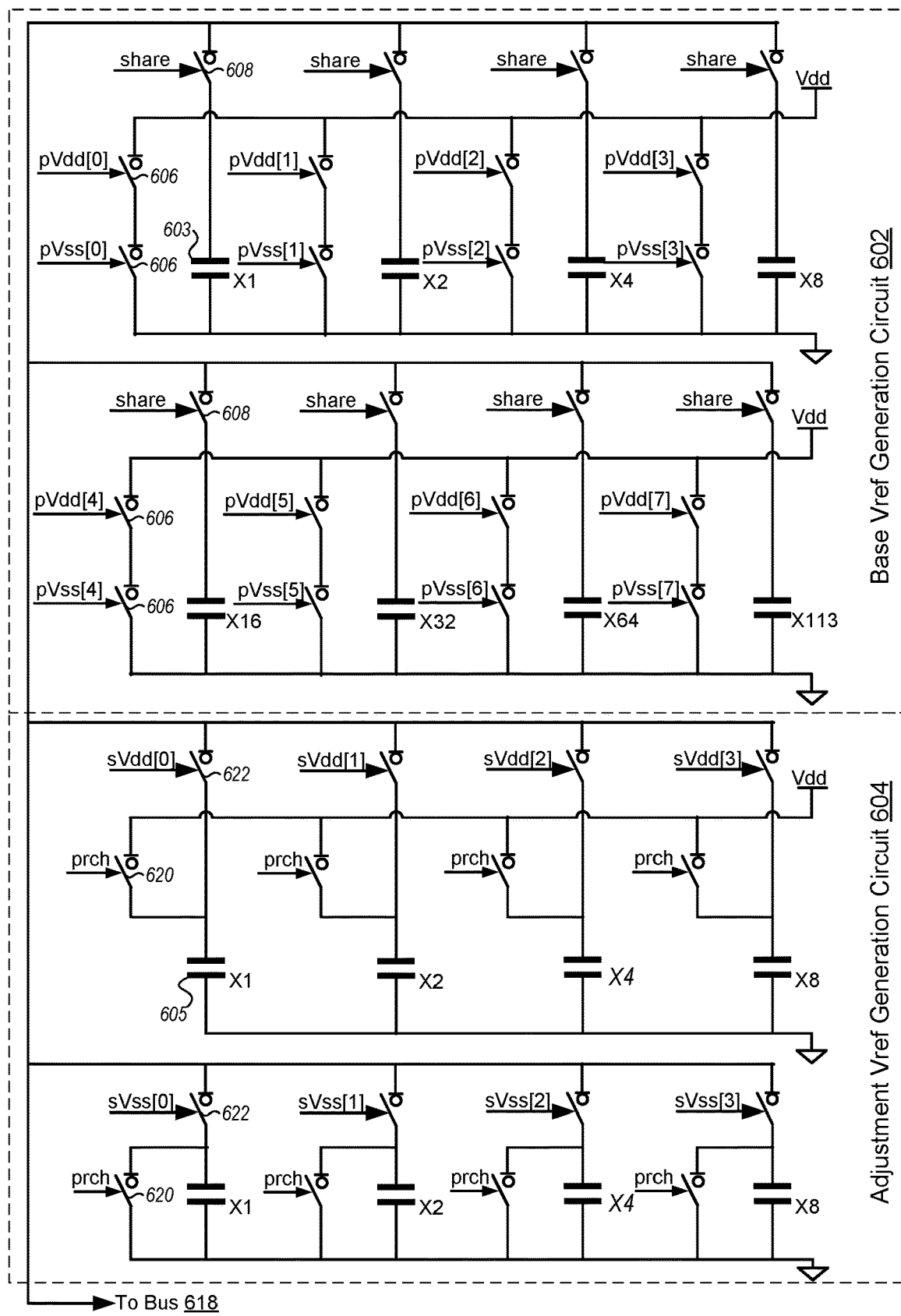
FIGS. 6A through 6C are schematic and block diagrams illustrating a reference voltage generator including a base $V_{REF}$ generation circuit and an on-the-fly adjustment $V_{REF}$ circuit.

An embodiment of a reference voltage generator will now be described in greater detail with reference to FIGS. 6A through 6C. FIG. 6A is a detailed schematic diagram of a portion of an embodiment of a reference voltage generator including a base reference voltage ($V_{REF}$) generator or generation circuit 602 and an on-the-fly, adjustment $V_{REF}$ generation circuit 604. Generally, the reference voltage generator includes an array of metal-oxide-silicon (MOS) capacitors arranged in binary groupings, each coupled through a number of first MOS switches 606 to a positive voltage supply or source (Vdd) and to negative supply voltage (Vss) or ground to pre-charge the capacitors, and number of second MOS switches 608 to a distribution bus 618 to share charges on the capacitors in the base $V_{REF}$ generation circuit 602 generate the base reference voltage. The capacitors are divided between the base $V_{REF}$ generation circuit 602 and the adjustment $V_{REF}$ generation circuit 604. The overall number of capacitors will depend on values of Vdd and Vss, and the number of incremental voltages between Vdd and Vss chosen for potential reference voltages. Similarly, the number of capacitors included within the base $V_{REF}$ generation circuit 602 and the adjustment $V_{REF}$ generation circuit 604 will depend on the number of incremental voltages between Vdd and Vss chosen for adjustment reference voltages.

In the embodiment shown, the base $V_{REF}$ generation circuit 602 includes a first array of 225 metal-oxide-silicon (MOS) capacitors 603, arranged in binary groupings. That is, there is one capacitor by itself (X1), and there is a grouping of 2 capacitors (X2), a second grouping of 4 capacitors (X4) and so on with the number of capacitors in each successive grouping doubling. The one exception to this arrangement is that the largest set or grouping (X113) has 113 capacitors instead of 128, with the remaining capacitors being included in a second array of 15 capacitors 605 in the adjustment $V_{REF}$ generation circuit 604 to facilitate an address-dependent adjustment of the reference voltage as described below.

Input signals pVdd[0:7] and pVss[0:7] control switches 606 in the base $V_{REF}$ generation circuit 602 to precharge the sets of capacitors to Vdd or Vss, respectively. The binary arrangement of the MOS capacitors allows incremental control of the capacitors in individual steps from 1 to 255 capacitors based on the state of base $V_{REF}$ setting provided by pVdd[0:7] and pVss[0:7] signals. The pVdd[0:7] and pVss[0:7] signals are generated by first logic circuits 610, such as that shown in FIG. 6B and included in the reference voltage generator. Referring to FIG. 6B, a precharge signal (prch) is supplied to first inputs of first and second AND gates 612, 614. Next, a base $V_{REF}$ setting signal is supplied from the configuration circuits (configuration circuits 416 in FIG. 4) to a second input of the first AND 612 gate and through a first inverter 616 to a second input of the second AND 614 gate to generate the pVdd[0:7] and pVss[0:7] signals respectively. Although only one first logic circuit 610 is shown in FIG. 6B it will be understood that the reference voltage generator includes multiple logic circuits, one for each grouping of MOS capacitors X1 through X113.

One advantage of the design of the reference voltage generator arises because some time is required for the capacitors to be reliably precharged to Vdd or Vss and ready for the next memory cycle. Therefore the pVdd[0:7] and pVss[0:7] signals cannot be set on-the-fly based on an incoming address. In the design shown, these input settings (the pVdd[0:7] and pVss[0:7]) are set to enable the base $V_{REF}$ generation circuit 602 to provide a common or base reference voltage for all blocks in the memory array. After the precharge step, all the capacitors in the base $V_{REF}$ generation circuit 602 are connected to each other (charge-shared) and onto the distribution bus 618 out of the reference voltage generator by closing switches 608 controlled by the share signal.

The adjustment $V_{REF}$ generation circuit 604 includes a second array or block of two sets of 15 capacitors, each in binary groupings: X1, X2, X4, and X8. These sets or groupings of capacitors are precharged by switches 620 that are controlled by the precharge signal (prch). All of the first set of 15 capacitors is precharged to Vdd and all of the second set is precharged to Vss. After the precharge step, selected groupings from these sets of 15 capacitors are shared onto the distribution bus 618 by switches 622 selectively controlled by the sVdd[0:3] and sVss[0:3] input signals. The sVdd[0:3] and sVss[0:3] signals are generated by second logic circuits 624 included in the reference voltage generator such as that shown in FIG. 6C. Referring to FIG. 6C, the same share signal used to couple the capacitors in the base $V_{REF}$ generation circuit 602 to the distribution bus 618 is applied to a first input of a third AND gate 626. Next, an adjustment $V_{REF}$ setting signal supplied by the digital control circuits 418 is applied to a second input of the third AND gate 626 to generate the sVdd[0:3] signal and through a second inverter 628 the sVss[0:3] signal. Again, although only one second logic circuit 624 is shown in FIG. 6C it will be understood that the reference voltage generator includes multiple second logic circuits to generate signals sVdd[0] through sVdd[3] and signals sVss[0] through sVss[3].

An important feature of this design is that the sVdd[0:3] and sVss[0:3] signals can be changed on-the-fly based on an incoming address because there is a complete set of 15 capacitors precharged to Vdd and Vss, ready to be selectively shared to the distribution bus 618 without delay.

Figure 6B:
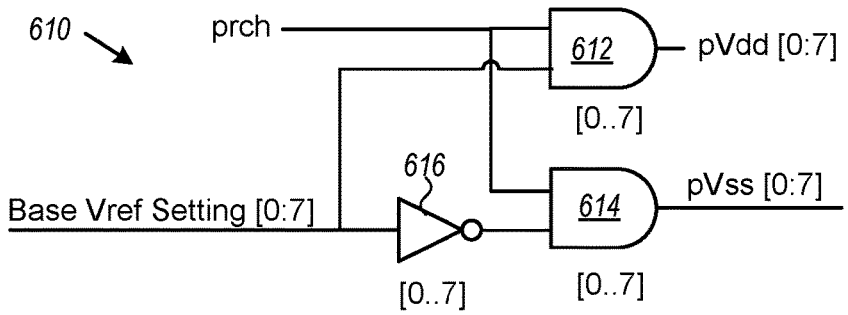
Figure 6C:
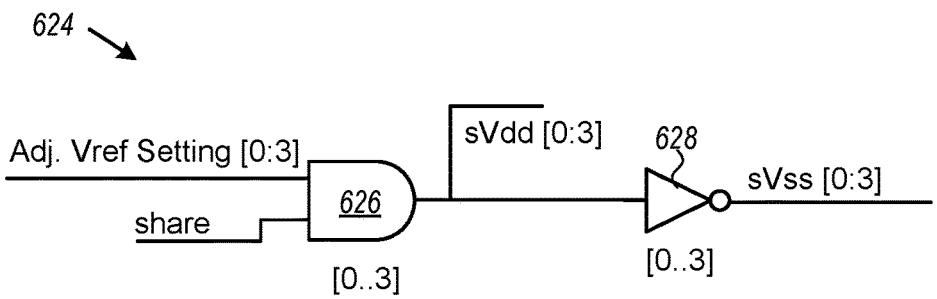
Figure 7:
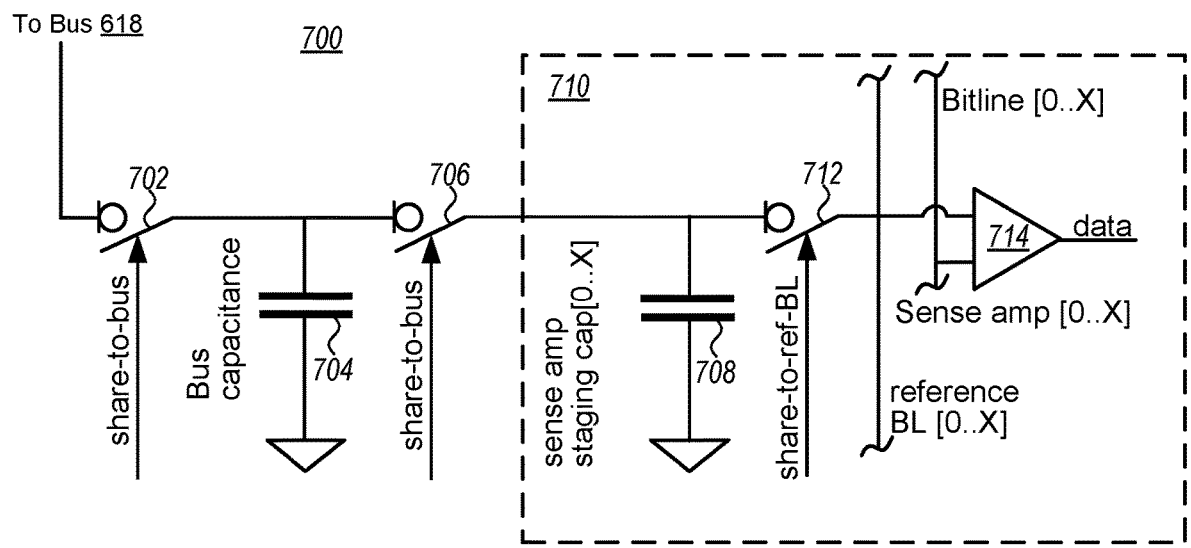
FIG. 7 is a schematic diagram of a sensing circuit and switches coupling the Local reference voltage generator of FIG. 6 to a memory array in a system.

FIG. 7 is a schematic diagram showing a circuit for coupling the Local reference voltage generator of FIGS. 6A-6C to a sensing circuit and through the sensing circuit to a bitline (BL) in a memory array. Referring to FIG. 7 circuit 700 includes a first MOS switch 702 through which the distribution bus 618 from the reference voltage generator is coupled a bus capacitor 704, and a second MOS switch 706 through which the bus capacitor is coupled to a staging capacitor 708 in a sensing circuit 710. While a share-to-bus signal applied or asserted to the first and second MOS switches 702, 706, charge developed on the capacitor arrays of the reference voltage generator is shared onto the staging capacitor 708. The sensing circuit 710 further includes a third switch 712 coupled between the staging capacitor 708 and a comparator or sense amplifier (sense amp 714) in the sensing circuit 710. While a share to reference BL signal (share-to-ref-BL) is asserted, and generally after the share-to-bus signal has been de-asserted, an address-dependent local reference voltage generated by the charge shared onto staging capacitor 708 is applied to a reference bitline (BL) input of the sense amp 714. It will be understood that elements shown on the left-hand side FIG. 7, i.e., the first and second MOS switches 702, 706, and the bus capacitor 704, can be included in the Local reference voltage generator or in the sensing circuit 710.

Although only one sensing circuit 710 is shown in FIG. 7 it will be understood that the memory device or system (not shown) generally includes multiple sensing circuits from 1 to x, where x is equal to a number of bitlines (BL) in each block of a memory array to be read.

Figure 8:
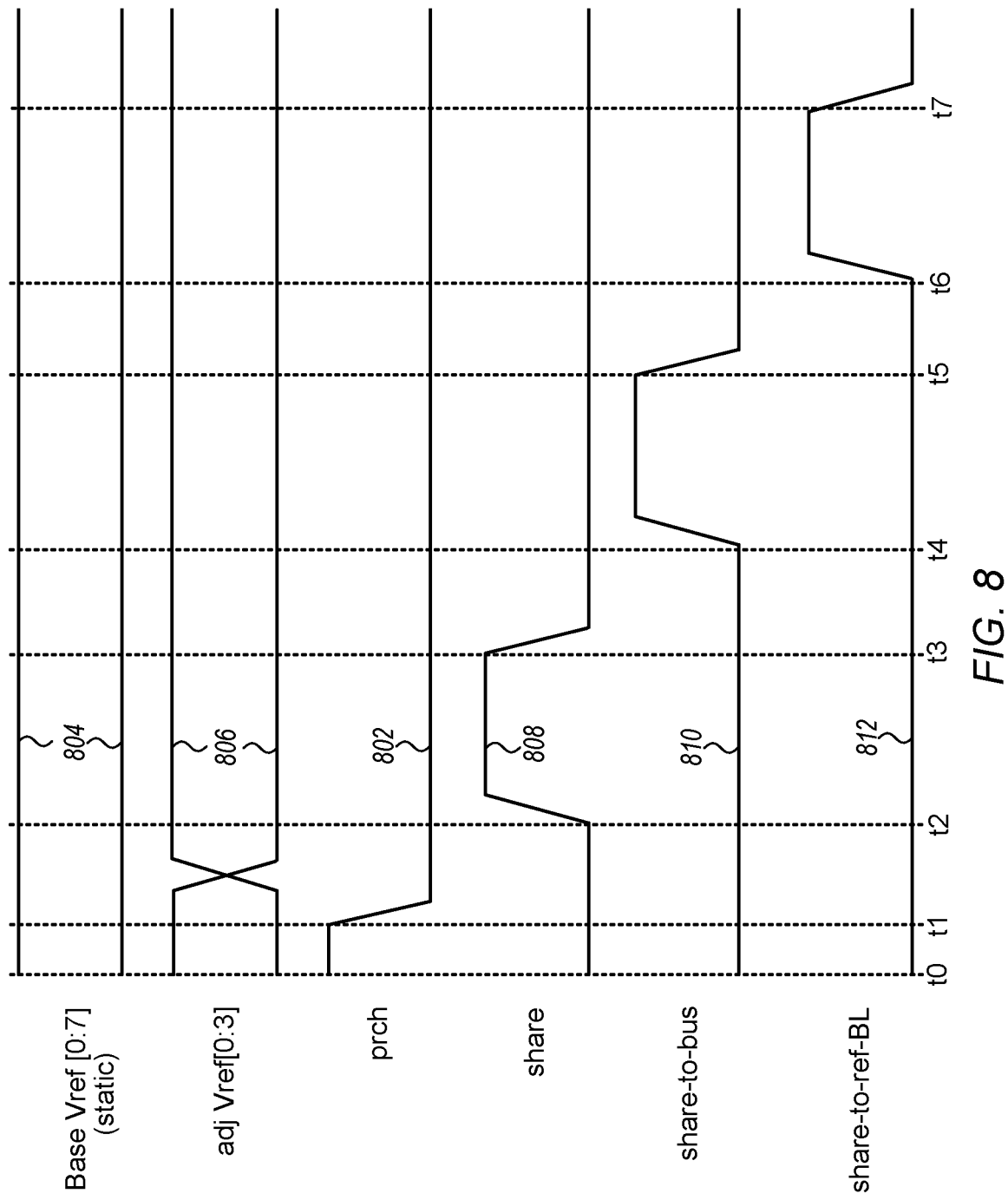
FIG. 8 is a timing diagram for signals to the Local reference voltage generator of FIGS. 6A through 6C.

Operation of an embodiment of a local reference voltage generator to generate an address-dependent local reference voltage will now be described with reference to FIGS. 6A-6C, and 7, and to FIG. 8, which shows a timing diagram for signals shown in FIGS. 6A-6C and FIG. 7. Referring to FIG. 8, the operation begins with asserting a precharge signal (prch 802) from t0 to t1 to precharge capacitors in the adjustment $V_{REF}$ generation circuit 604. During this time the base $V_{REF}$ settings or signals (Base $V_{REF}$[0:7] 804) are static and are coupled to the logic circuit 610 along with the precharge signal to generates signals pVdd[0:7] and pVss[0:7] to precharge the capacitors in the base $V_{REF}$ generation circuit 602. At time t1 the a precharge signal is de-asserted, and between time t1 and t2 adjustment $V_{REF}$ settings (adj. $V_{REF}$[0:3] 806) based on addresses in a block being read are coupled to the second logic circuit 624 in preparation for selectively sharing a number of the capacitors in the adjustment $V_{REF}$ generation circuit 604 to the distribution bus 618. At time t2 the share signal 808 is asserted closing second switches 608 to share charges on the capacitors in the base $V_{REF}$ generation circuit 602 to the distribution bus 618. At substantially the same time the share signal applied to the third AND gate 626 in the second logic circuit 624 generates signals sVdd[0:3] and sVss[0:3] to close switches 622, sharing the charges on selected capacitors in the adjustment $V_{REF}$ generation circuit 604 to the distribution bus 618. At time t3 the share signal is de-asserted opening switches 608 and 622. From time t4 to time t5 a share-to-bus signal 810 is asserted closing first switches 702 and second switches 706 and allowing the charge developed on the capacitor arrays of the reference voltage generator to be shared onto the staging capacitor 708. From time t6 to time t7 share-to-ref-BL signal 812 is asserted enabling an address-dependent local reference voltage generated by the charge shared onto staging capacitor 708 to be applied to the reference BL input of the sense amp 714.

Figure 9A:
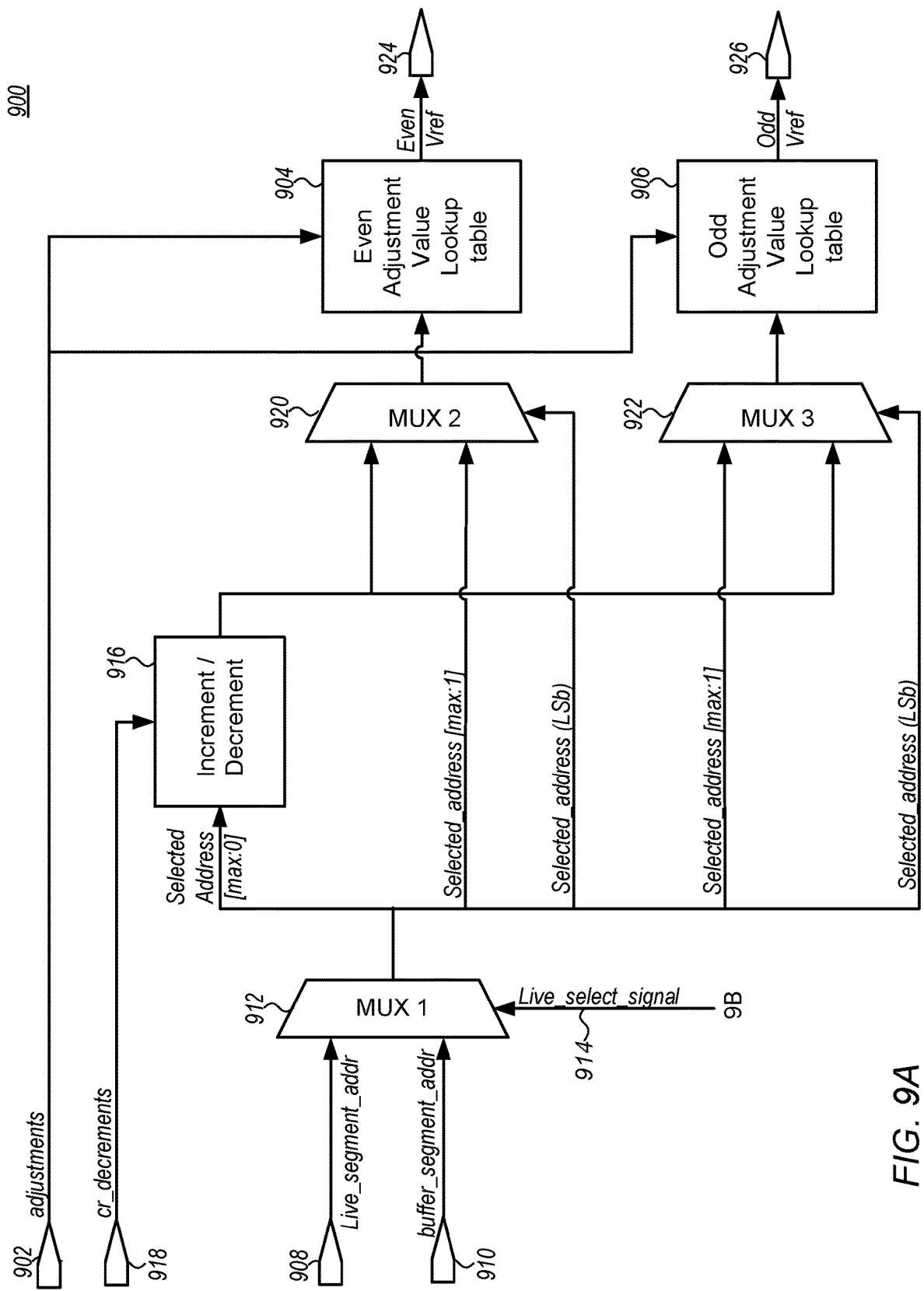
FIGS. 9A and 9B are schematic diagrams of local reference voltage selection circuitry to retrieve the $V_{REF}$ adjustment values from lookup tables stored in supervisory memory based on memory addresses.

Local reference voltage selection circuitry used with or included in the reference voltage selection circuitry 414 to retrieve the $V_{REF}$ adjustment values from lookup tables based on memory addresses and adjust or trim the reference voltage on-the-fly will now be described with reference to the schematic diagrams FIGS. 9A and 9B. Referring to FIG. 9A the selection circuitry 900 receives an adjustment signal 902 as a vector containing previously determined adjustment values for each segment or block of the memory array. Each segment uses the same number of bits for adjustment. The vector signal is a concatenation of all the adjustment values in the order that the addresses of the segments appear in the memory array. The adjustment signals or vectors are coupled to an even adjustment value lookup table 904 and an odd adjustment value lookup table 906. The even adjustment value lookup table 904 stores a selected subset of that vector for only the segments whose segment addresses are even numbered. The odd adjustment value lookup table 906 is a selected subset of that vector for only the segments whose segment addresses are odd numbered. A live_segment_addr signal 908 is received as a vector containing the address of the segment that is actively being accessed. It is updated only when a transaction is launched and when a burst transaction crosses an address boundary between segments. It remains static at the end of a transaction unless it is cleared by a reset. A buffer_segment_addr signal 910 is received as a vector signal containing the address of the segment that has yet to be launched and may not yet be a complete value in that the address is still being transmitted from the source of the address to the selection circuitry 900, however it is always available and remains static once the entire value has been received by the selection circuitry. A first multiplexer 912 selects between the live_segment_addr and the buffer_segment_addr based on a live_select signal 914 received from portion of the select circuitry shown in FIG. 9B, and outputs a selected address. Burst transactions naturally increment addresses during a data phase as the burst progresses. To facilitate burst transactions the selection circuitry 900 includes an increment/decrement block 916 to calculate a successor address to the present selected address based on the state of a received cr_decrement signal 918. When asserted, the cr_decrement signal 918 indicates that the successor address should be a decrement operation from the present address within this burst transaction. The increment/decrement block 916 provides the successor address to a second multiplexer 920 coupled to the even adjustment value lookup table 904 and to a third multiplexer 922 coupled to the odd adjustment value lookup table 906.

The least significant bit (LSb) of the present selected address determines whether that segment is considered even or odd. The LSb is used as a selector for the second and third multiplexers 920, 922. When the LSb is 0 the second multiplexer 920 coupled to the even adjustment lookup table 904 selects the present address, and the selected address with the LSb truncated is provided as an index into the even adjustment lookup table. When the LSb is 1 the second multiplexer 920 coupled to the even adjustment lookup table 904 selects the successor address, and the selected address with the LSb truncated is provided as an index into the even adjustment lookup table 904. The result of the lookup is provided on an even_Vref vector signal 924. When the LSb is 0 the third multiplexer 922 coupled to the odd adjustment value lookup table 906 selects the successor address, and the selected address with the LSb truncated is provided as an index into the odd adjustment value lookup table 906. When the LSb is 1 the third multiplexer 922 coupled to the odd adjustment value lookup table 906 is selected, and the selected address with the LSb truncated is provided as an index into the odd adjustment value lookup table 906. The result of the lookup is provided on an odd_Vref vector signal 926.

Figure 9B:
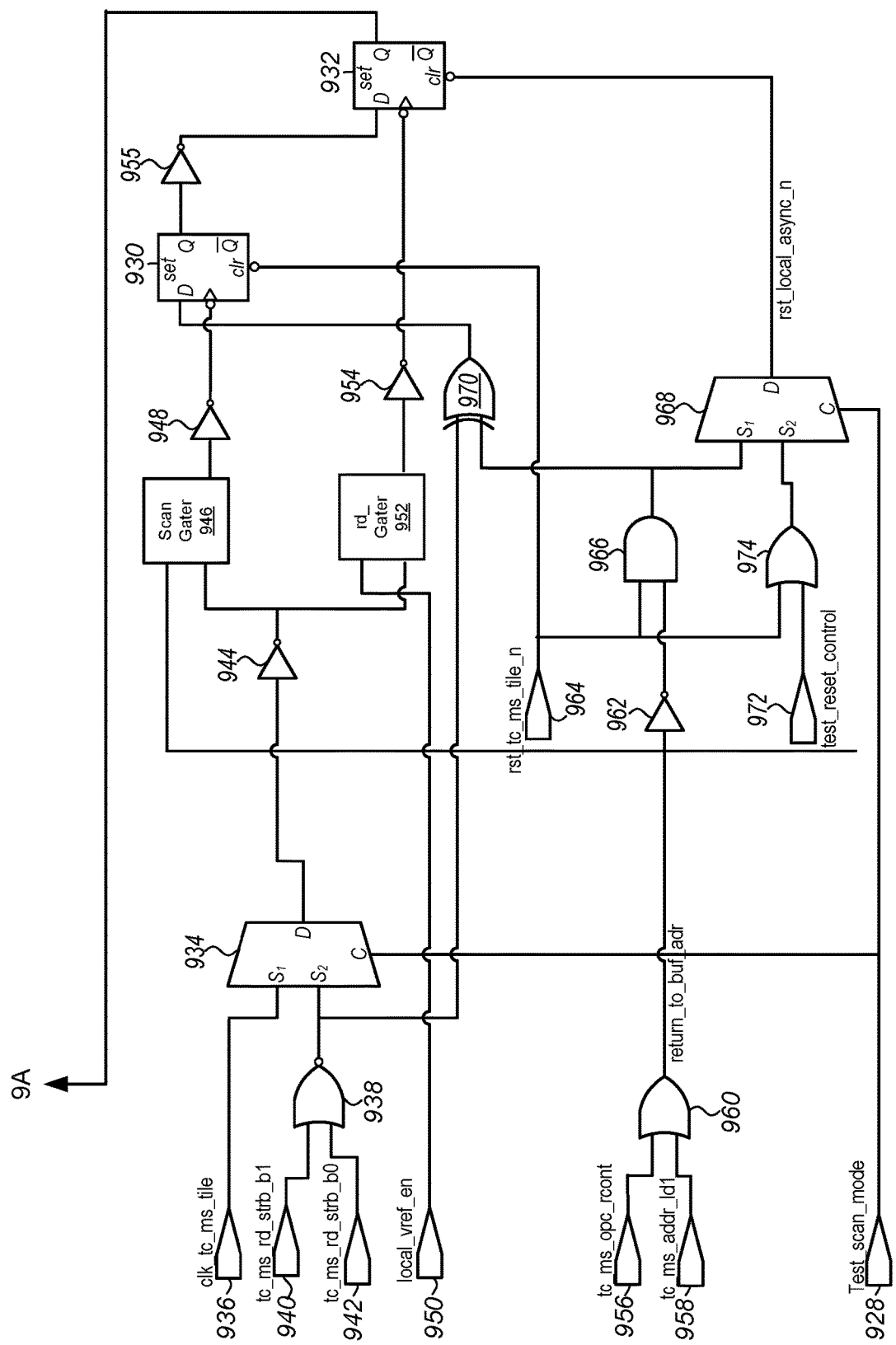

The state of the live_select signal 914 is determined from the select circuitry shown in FIG. 9B. Referring to FIG. 9B, a test_scan_mode signal 928 selects a mode of operation for the selection circuitry 900. When the test_scan_mode signal 928 is 1, the mode is a test_scan_mode wherein all flip-flops 930, 932, operate using a synchronous clock signal, and wherein all other elements in functional path are not expected to operate. When test_scan_mode signal 928 is 0, the selection circuitry 900 is in the operational mode, and clock signals to flip-flop 930, 932, may be asynchronous. A first multiplexer 934 selects clock signals to be passed to the flip-flops 930, 932, and other elements based on the test_scan_mode signal 928. When the test_scan_mode signal 928 is 1, the first multiplexer 934 passes a synchronous clk_tc_ms_tile clock signal 936 in which the active edge of the clock signal is on a falling edge. When test_scan_mode signal 928 is 0, the signal passing through the first multiplexer 934 is a result of a logical NOR 938 of active read strobe signals (tc_ms_rd_strb_b1 clock signal 940 and tc_ms_rd_strb_b0 clock signal 942), which indicate the start of a macro read operation. An output of the first multiplexer 934 is passed through an inverter 944 to a clock gating cell (scan_gater 946) enabled by the test_scan_mode signal 928. The output from the scan_gater 946 is inverted by inverter 948 and provided to the scan control/observation flip-flop 930, and only toggles the flip-flop when the selection circuitry 900 is operating in scan mode.

The local $V_{REF}$ lookup operation is enabled by a local_vref_en signal 950, which is a control signal that is provided to generate the live_select signal 914 by enabling a clock signal to the live_select flip-flop 932 through a clock gating cell (rd_gater 952). The rd_gater 952 receives an inversion of the clock that is passed through the first multiplexer 934. An output of the rd_gater 952 is subsequently inverted by an inverter 954 such that the phase of the output matches the phase of the clock that passed through the first multiplexer 934, and the clock to the live_select flip-flop 932 toggles only when the local_vref_en signal 950 is 1. A rising edge on either tc_ms_rd_strb_b1 signal 940 or a rising edge on tc_ms_rd_strb_b0 signal 942 while local_vref_enable signal 950 is 1 the Q output of flip-flop 930 operating through inverter 955 will cause the flip-flop 932 to capture the data at its D input, thus indicating on live_select signal 914 that the address to use at that time is live_segment_address signal 908.

When a new transaction is started, it is either a read transaction or it is not, and if it is a read transaction, it either includes an address phase, or does not. When the present transaction is a read transaction that does not include an address phase, then the intended address is address zero, and a tc_ms_opc_rcont signal 956, which is a pulse whose duration is one clock period, is received that indicates the starting address of zero will be found on the buffer_segment_addr signal 910 shown in FIG. 9A. When the present transaction is a read transaction that includes an address phase, a tc_ms_addr_ld1 signal 958 is received, which is a pulse whose duration is one clock period, that indicates the starting address of the transaction will be found on the buffer_segment_addr signal 910. When the new transaction is not a read transaction, then neither tc_ms_opc_rcont signal 956 nor tc_ms_addr_ld1 signal 958 assert, and the starting address of the transaction will be found on live_segment_addr signal 908.

The tc_ms_opc_rcont signal 956 and tc_ms_addr_ld1 signal 958 are combined in a logical OR operation by an OR gate 960 to generate a return_to_buf_adr signal, which is inverted through inverter 962 and combined with an active-low reset signal (rst_tc_ms_tile_n 964) in an AND gate 966. The resultant logical AND is input to a second multiplexer 968 and when selected will clear or reset the live_select flip-flop 932 if either the tc_ms_opc_rcont signal 956 or the tc_ms_addr_ld1 signal 958 are received. The output from AND gate 966 is also combined with the output from OR gate 938 in an exclusive OR gate 970 to provide a data input to the scan control/observation flip-flop 930. The data input to the scan control/observation flip-flop 930 can be logically expressed as follows: ((NOT(return_to_buf_adr)) AND rst_tc_ms_tile) XOR (tc_ms_rd_strb_b0 NOR tc_ms_rd_strb_b1)). As a result when the 900 is operating in scan mode it is possible to observe stuck-at faults on any of the signals used as inputs to this circuit. The reset state of the output of the scan control/observation flip-flop 930 is 0, and, when the test_scan_mode signal 928 is 0, the default state of a D input to the live_select flip-flop 932 (coupled from the Q output of flip-flop 930 operating through inverter 955) is 1. A test_reset_control signal 972, when asserted, forces any subsequent active-low reset signals into their inactive-high state. When test_scan_mode is 1, the second multiplexer 968 selects the logical OR of test_reset_control with rst_tc_ms_tile_n 964. When test_scan_mode 928 is 0, the second multiplexer 968 selects the logical AND of rst_tc_ms_tile_n 964 with (NOT(return_to_buf_adr)). The output of the second multiplexer 968 is called rst_local_async_n. It provides the active-low reset signal to live_select flip-flop 932.

Figure 10:
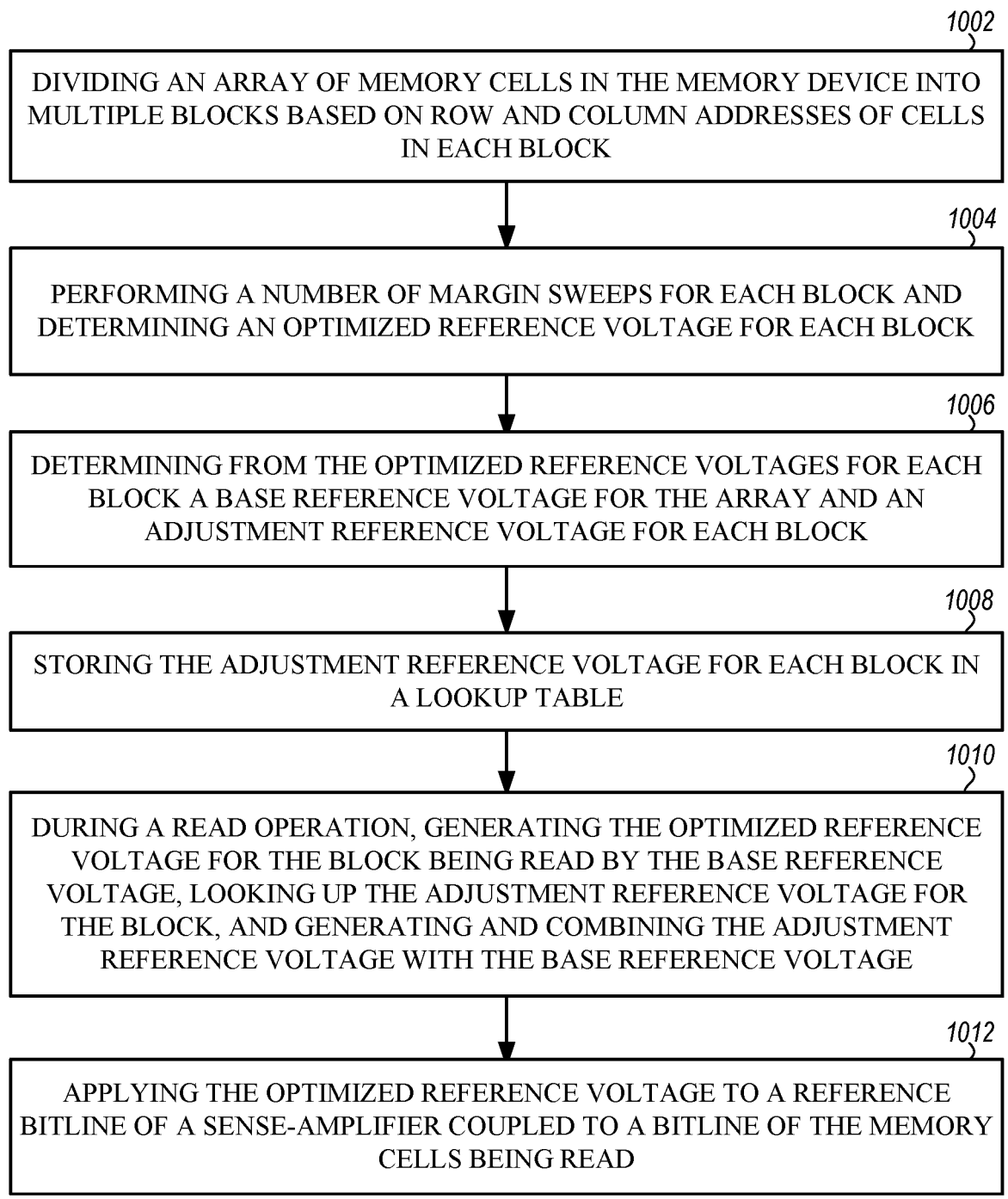
FIG. 10 is a flowchart of a method for determining base and adjustment voltages for a memory device or system including multiple blocks and using address-dependent local reference voltages and operating the memory device or system.

Methods for determining base and adjustment voltages and operating a memory device or system using address-dependent local reference voltages will now be described with reference to the flowchart of FIG. 10. Referring to FIG. 10, generally the method begins with dividing an array of memory cells in a memory device into multiple blocks based on row and column addresses of cells in each block (1002). As noted above, this can include only logically dividing the array, or physically dividing the array such that each individual block is provided with an optimized, local reference voltage from one of a number of local reference voltage generators coupled to one or a small number of blocks in the larger memory array. The division can also include logically or physically dividing the larger memory array into multiple sub-arrays each including one or more blocks.

Next a number of margin sweeps are performed on each block and an optimized, local reference voltage determined for each block (1004). The local reference voltage is that voltage which provides a predetermined or predefined minimum margin (U-margin) between the local reference voltage and the highest erase-term or U-term in the block. As noted above, because the erase-terms or U-terms are generally less subject to statistical variations and observed to be more stable over time and temperature the predefined minimum margin is generally selected to be substantially less than a margin (P-margin) between the local reference voltage and the lowest program-term or P-term in the block.

By margin sweep it is meant sweeping or monotonically, incrementally increasing or decreasing a reference voltage applied to the memory array or block and repeatedly reading the memory cells to determine the bitline signal or voltage from reading and program or P-terms and erase or U-terms. As noted above, there is an expected statistical variation in bitline signal resulting from reading different memory cells due to process, voltage and temperatures. In particular, in F-RAM there is an expected statistical variation in P-Terms and U-Terms from variations in dimensions and dielectric constants of ferroelectric layers in the ferroelectric capacitors.

Figure 1:
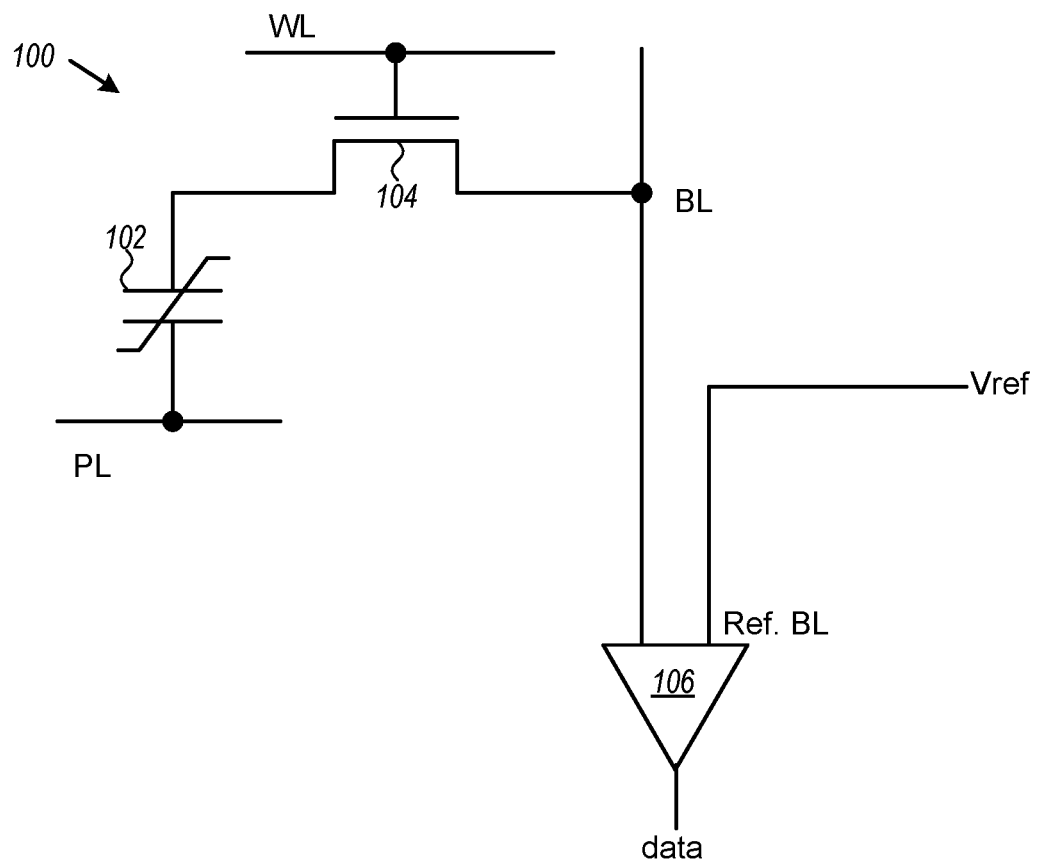
FIG. 1 is a schematic diagram of a one-transistor, one-capacitor (1T1C) ferroelectric random access memory (F-RAM) cell.
Figure 2:
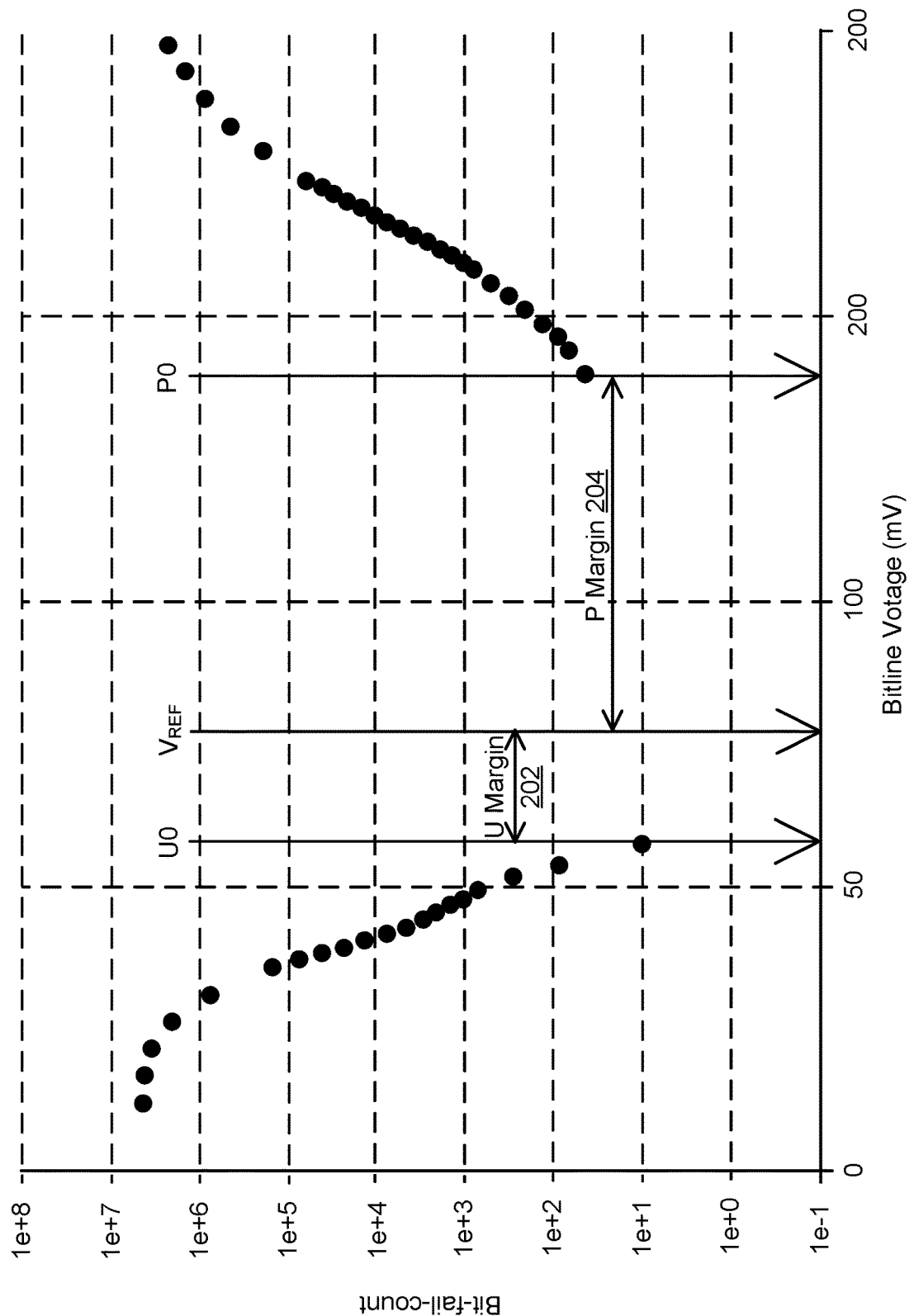
FIG. 2 is a plot illustrating margin sweep of memory signal from memory cells in a F-RAM array showing statistical variations in P-terms and U-terms and an effect on overall sensing margin.
Figure 3:
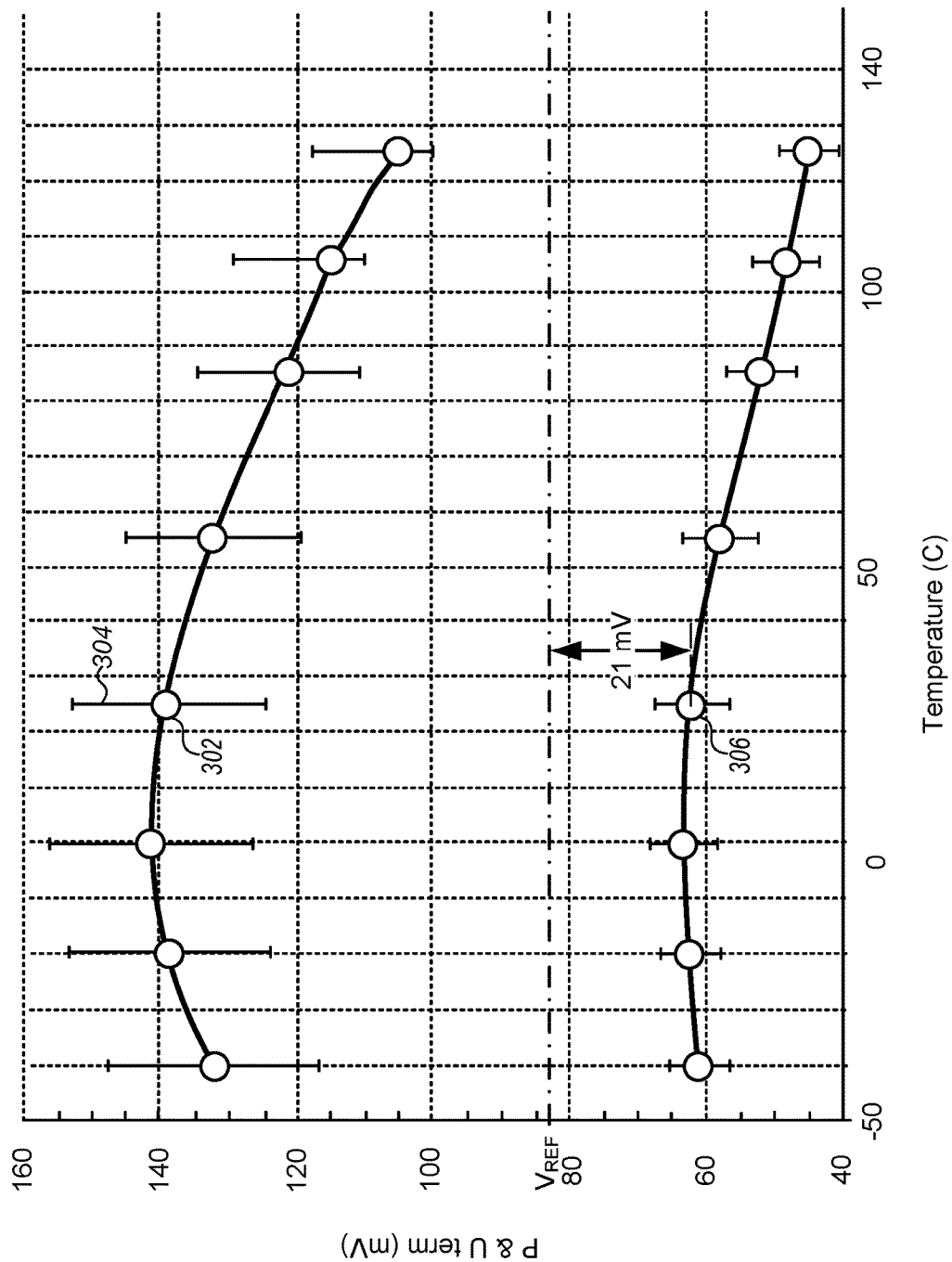
FIG. 3 is a graph shows a temperature dependence and time dependent degradation of P-terms and U-terms of memory cells in a F-RAM array.

To perform a margin sweep, the entire array or block is written to P-terms (internal 1's), and the memory is then read using a reference voltage is set to a low level—below a minimum of the statistical variation expected for the P-terms. At this reference voltage there should be 100% passing—that is, all cells should correctly reading as programmed or P-term. The reference voltage increased in steps and the writing and reading repeated. At some point, the reference voltage will be above the lowest P-term (P0) in the block, and the associated memory cell will fail—that is it they will incorrectly read as erased or U-term. As the reference voltage is increased, more and more programmed cells will be falsely read as erased, i.e., a reading fail (as predicted by the statistical variation). A graph can be made showing P-term bit-fail-count as a function of the swept reference voltages. After a predetermined number of increment, or after all or substantially all of the p-terms have failed, the process is repeated by writing an erased term or U-terms to the entire array or block, and sweeping the reference voltage from an initial high voltage—above a maximum of the statistical variation expected for the U-terms, to a lower voltage and developing a graph of U-term bit-fail-count as a function of reference voltage. These two graphs can be combined as shown in FIG. 2 above. The separation between the lowest P-term (P0) and a particular reference voltage represents the P-margin for that reference voltage. The separation between the highest U-term (U0) and the reference voltage represents the U-margin.

A base reference voltage for the entire array is then determined from the local reference voltages found for each block in the preceding step, and adjustment reference voltages of offsets from the base reference voltage determined for each block (1006). In one embodiment the base reference voltage is determined or selected by setting the base reference voltage to a voltage a predetermined or predefined amount from the highest internal '0' or U-term in the entire array. The adjustment reference voltages can then be determined by calculating a voltage by which the base reference voltage must be adjusted for each block to realize or obtain the local reference voltage found for that block. This will result in a constant or nearly constant margin (U-margin) between an address-dependent final or local reference voltage and the highest internal '0' or U-term in each block across the entire array. Furthermore, since margin is substantially lower than a margin (P-margin) between the local reference voltage and the lowest program-term or P-term in each block, the P-margins will also be maximized.

The adjustment reference voltage for each block is then stored in a lookup table in a supervisory memory coupled to the reference voltage generator (1008). Next, during a read operation of memory cells in one of the blocks the final or local reference voltage is generated by generating the base reference voltage, looking up the adjustment reference voltage for the block being read, and generating and combining the adjustment reference voltage with the base reference voltage (1010). Finally, the local reference voltage is coupled or applied to a reference bitline of a sense-amplifier coupled to a bitline of the memory cells being read (1012).

Improvements in memory margins for a memory device or system operated using address-dependent local reference voltages versus a conventional memory system operated using a single, global reference voltage will now be described with reference to FIGS. 11A and 11B, and FIGS. 12A and 12B.

Figure 11A:
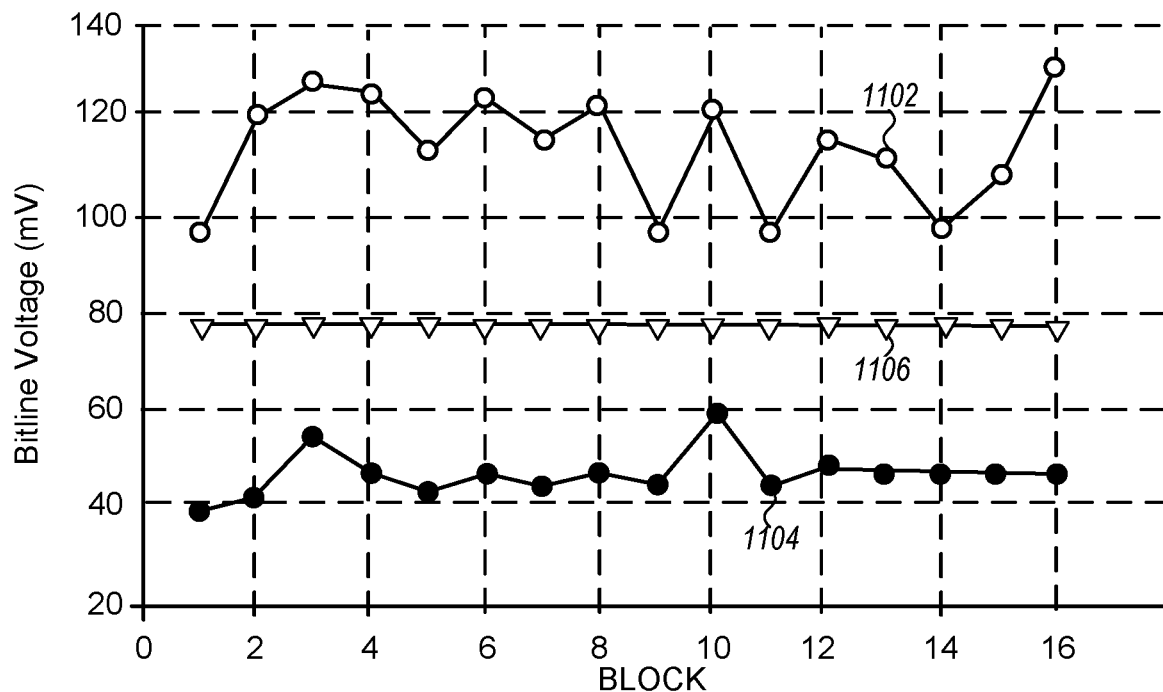
FIGS. 11A and 11B are graphs illustrating memory margin results for a memory system operated using a single, global reference voltage.
Figure 11B:
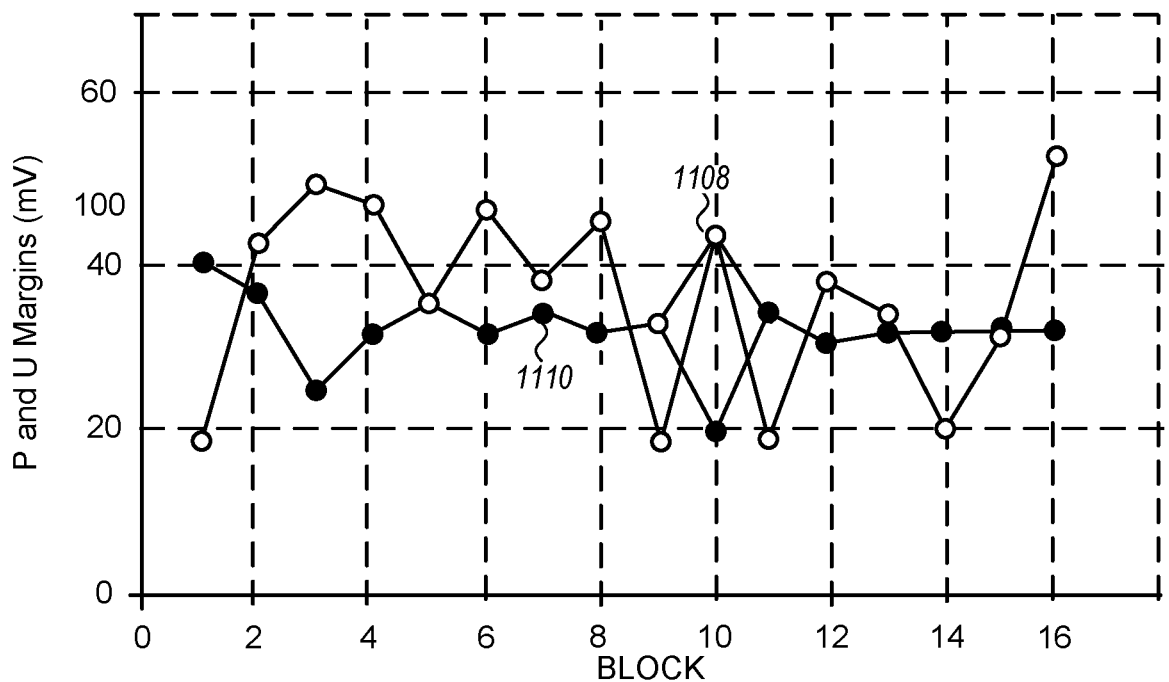

FIGS. 11A and 11B are graphs illustrating memory margin results for a memory device including a 4 Mb F-RAM array divided into sixteen 256 Kb blocks, and conventionally operated using a single, global reference voltage. Referring to FIG. 11A, illustrates a plot of lowest P-terms (P0) 1102 for each block in the array, a plot of highest U-term (U0) 1104, and a single, global reference voltage 1106 used in reading from all blocks in the array. The global reference voltage is selected in a conventional manner by selecting it to be a fixed offset from the highest U-term (U0) or lowest P-Term (P0) in the array. In this example, the global reference voltage was selected to have a 19 mV fixed offset from the highest U-term, shown here as being in block 10. FIG. 11B illustrates the resulting P-margins and U-margins across each block in the memory device conventionally operated using a single, global reference voltage 1106. Referring to FIG. 11B line 1108 represents the P-margin and line 1110 represents the U-margins. The resulting minimum, maximum and mean P-margin and U-margin are shown in Table 1 below. It is noted that operating using a single, global reference voltage results in P-Margins as low as 18 mV, which is problematic and could lead to bit or read failure in the event of rising temperatures, and will likely shorten the operating life of the memory device.

TABLE 1

|  | P-Margin | U-Margin |
| --- | --- | --- |
| Minimum | 18 mV | 19 mV |
| Maximum | 53 mV | 40 mV |
| Mean | 36 mV | 31 mV |

Figure 12A:
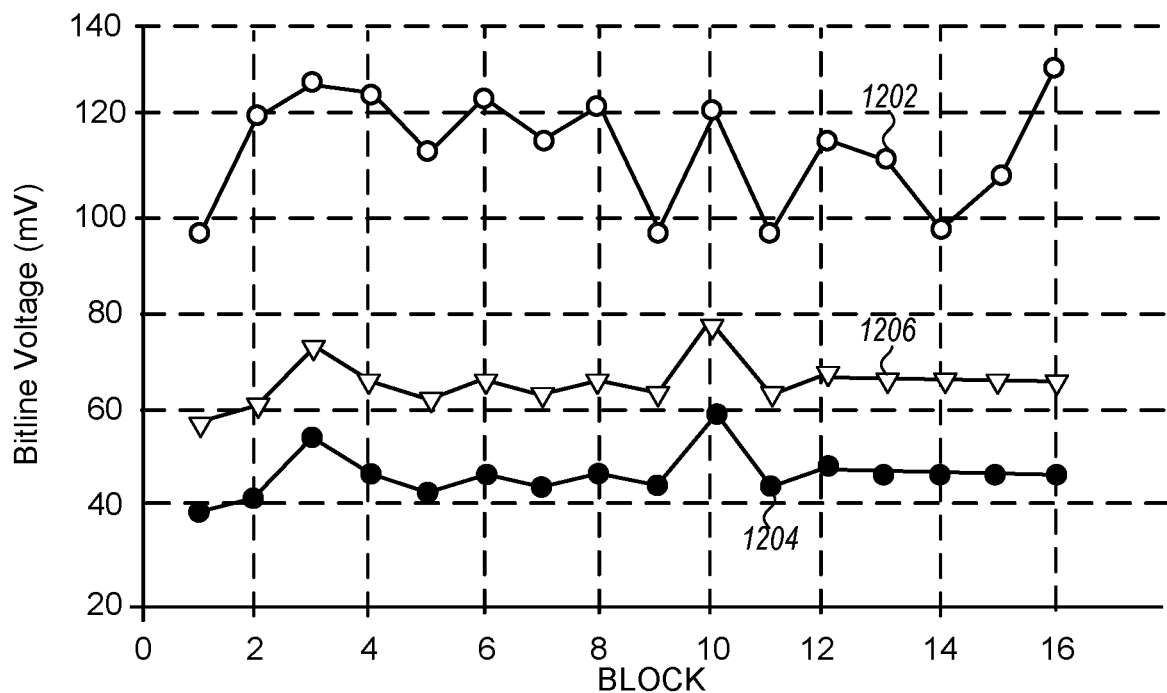
FIGS. 12A and 12B are graphs illustrating memory margin results for a memory system operated using address-dependent local reference voltages.
Figure 12B:
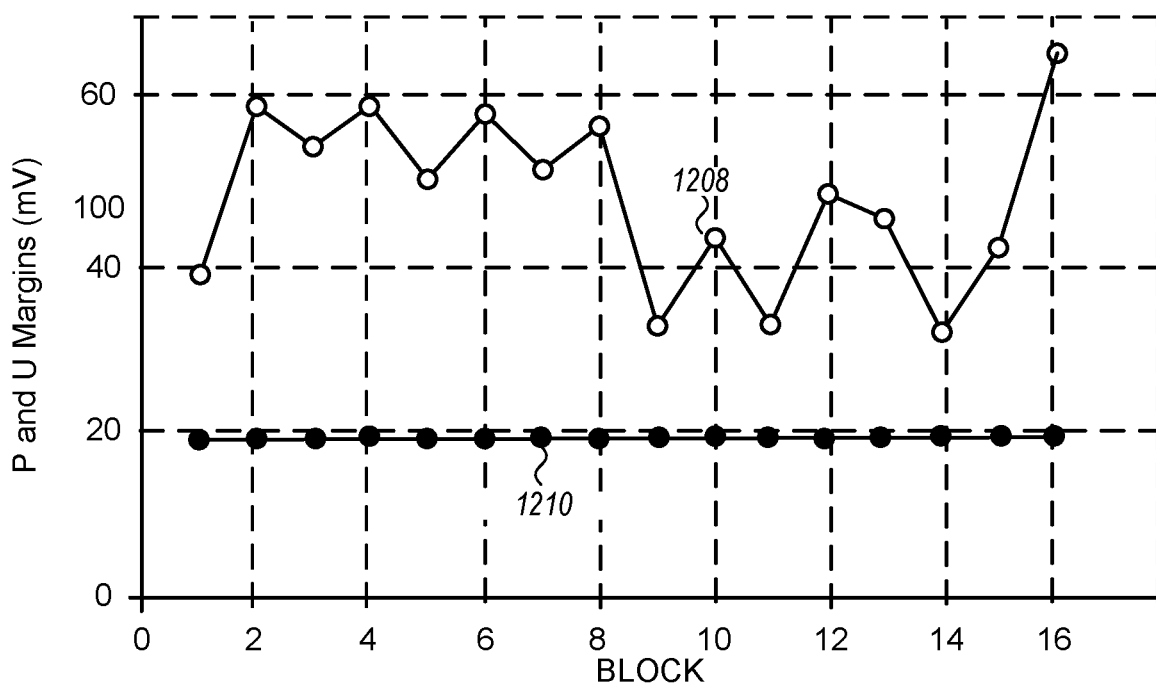

FIGS. 12A and 12B are graphs illustrating memory margin results for the same memory device operated using address-dependent local reference voltages as described herein. FIG. 12A illustrates plots of lowest P-terms (P0) 1202 for each block in the array, the highest U-terms (U0) 1204, and sixteen (16) address-dependent local reference voltages 1206. As described above the address-dependent local reference voltages 1206 were determined using the method described above. That is a base reference voltage was determined by setting it at a predefined offset from the highest U-term (U0) in the array, i.e., a 19 mV above the U0 of block 10, determining adjustment reference voltages for each of the 16 segments or blocks, and generating local reference voltages for each of the 16 segments or blocks. FIG. 12B illustrates the resulting P-margins 1208 and U-margins 1210 across each block in the memory device operated using address-dependent local reference voltages. The resulting minimum, maximum and mean P-margin and U-margin are shown in Table 2 below. It is noted that the address-dependent local reference voltages result in substantially constant U-margins across all segments or blocks. It is further noted that operating using address-dependent local reference voltages results in a 63% increase in the minimum P-margin, and a 33% increase in the mean P-margin.

TABLE 2

|  | P-Margin | U-Margin |
| --- | --- | --- |
| Minimum | 31 mV | 19 mV |
| Maximum | 65 mV | 19 mV |
| Mean | 48 mV | 19 mV |

In another aspect, a local $V_{REF}$ Segment (LVS) repair method is disclosed for repairing failing bits a memory device with an array of NVM cells divided into multiple blocks and including a local reference voltage generator.

In a conventional, global repair method bits or memory cells with the lowest program-term or P-terms among all the memory cells in the array replaced by previously unused, spare bits or memory cells in the array or fabricated on a die or chip with the array. Briefly, the repair and replacement is generally accomplished prior to packaging the die by opening links decoupling the memory cell to be replaced from wordlines, platelines and bitlines in the array. The spare memory cell, which typically formed coupled to one or more of the same wordlines, platelines and bitlines as the memory cell being replaced is plate is coupled into the array in place of a failed memory cell by updating the row and column decoder in memory device so that bits addressed to the failed memory cell are instead directed to the spare memory cell.

The global repair method is satisfactory for memory devices having a single large array, and/or using a single global reference. However, in a memory device including an array of 1T1C cells divided into multiple blocks, and using a local reference voltage generator, such as those described above, the margin between a lowest program-terms or P-margin is determined by a difference between the lowest program-term or P0 in the block or segment and the address-dependent, local $V_{REF}$. Thus, the lowest program-term or P0 in entire array does not mean the associated cell or bit has the lowest P-margin since the local $V_{REF}$ is not the same for all local blocks or segments. Therefore, using the global repair method in a memory device including multiple blocks, and using a local reference voltage generator will result in over-repair for some segments with lower refs and under-repair for some segments with a higher local $V_{REF}$.

In contrast the LVS repair method will repair bits with the lowest program-term or P-terms (P0) only within blocks or segments where the margin for the program-term or P-margin is below a predefined value. Thus, by using the LVS repair method, over repair is avoided for strong segments, under repair is avoided for weak segments, and the margin for the program-term or P-margin of the die is maximized.

Figure 13:
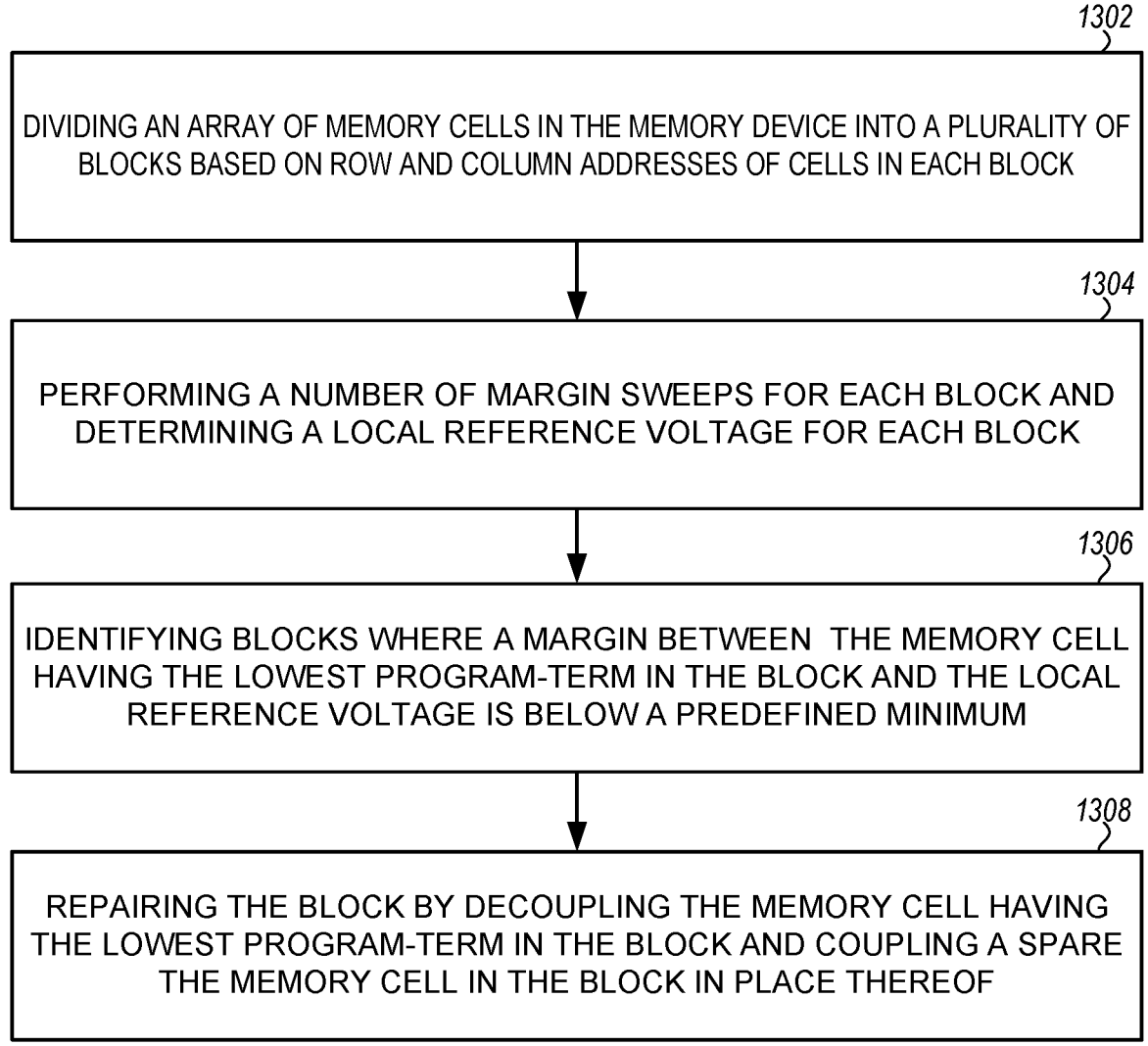
FIG. 13 is a flowchart of a method for using a local $V_{REF}$ Segment (LVS) repair method to repair failing bits in a memory device.

FIG. 13 is a flowchart of an embodiment of a LVS repair method for repairing failing bits in a memory device including an array of 1T1C NVM cells divided into multiple blocks, and further including a local reference voltage generator as described above. Referring to FIG. 13, generally the method begins with dividing an array of memory cells in a memory device into multiple blocks based on row and column addresses of cells in each block (1302). A number of margin sweeps are performed on each block and an optimized, local reference voltage determined for each block (1304). Next, blocks where a margin between the memory cell having the lowest program-term or P0 in the block and the local reference voltage is below a predefined minimum are identified (1306). The block is then repaired by decoupling the memory cell having the lowest program-term or P0 in the identified blocks having a margin below a predefined minimum, and coupling a spare the memory cell in the block in place thereof (1308).

Figure 14:
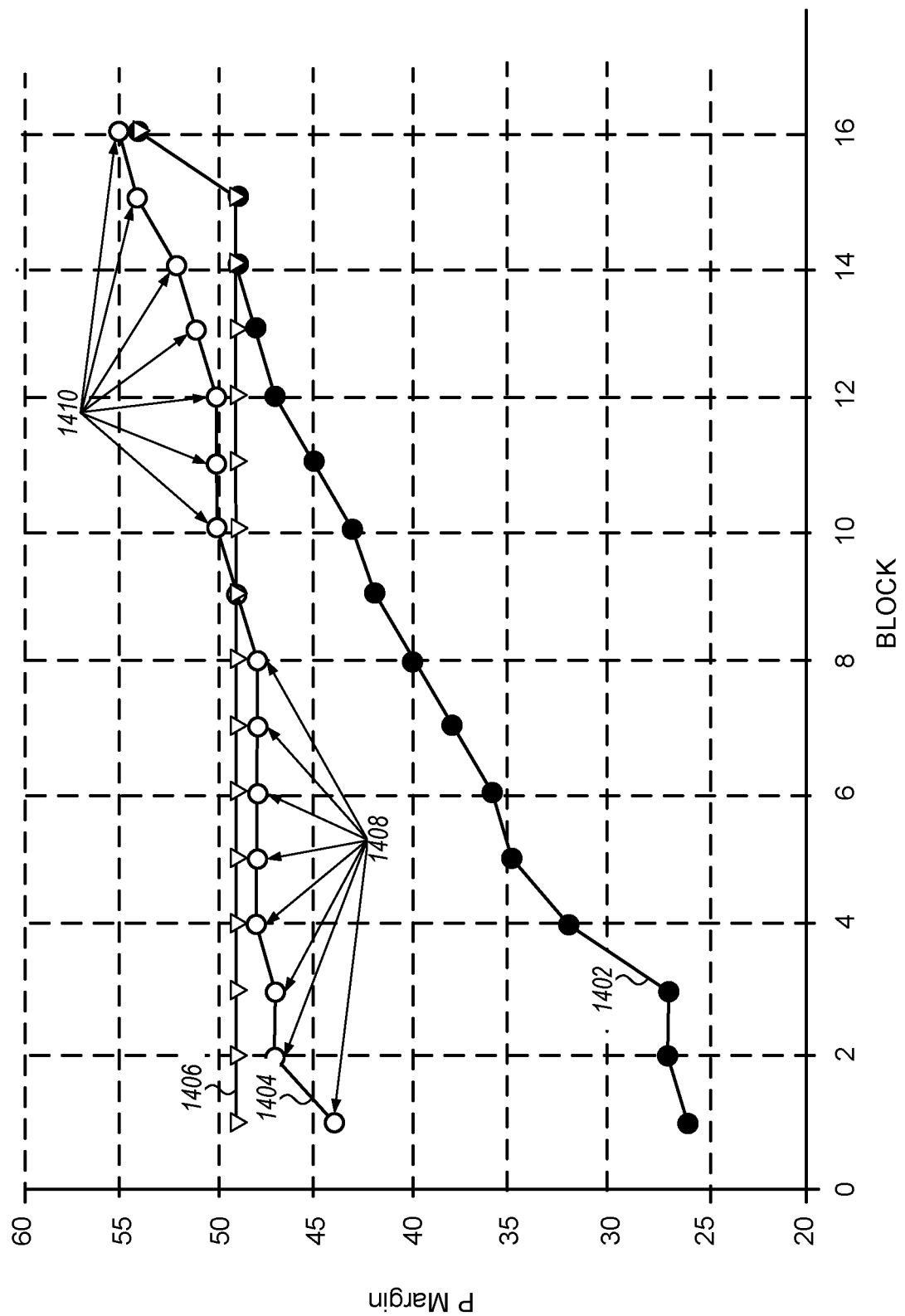
FIG. 14 shows graphs P-margins of an unrepaired memory device, the same memory device repaired using a global repair method, and memory device repaired using the LVS repair method.

Advantages and improvements in the LVS repair method over a conventional, global repair method for repairing failing bits a memory device with an array of 1T1C cells divided into multiple blocks will now be described with reference to graphs shown in FIG. 14. The graphs of FIG. 14 illustrate P-margins of an unrepaired memory device, the same memory device repaired using a 40-bit global repair method, and memory device repaired using the LVS repair method. The data for the graphs shown in FIG. 14 was obtained using a 4 Mb F-RAM array divided into sixteen 256 Kb segments or blocks, and operated using sixteen (16) address-dependent local reference voltages. Bits or memory cells with failing P-terms were then repaired using first a global repair method and the LVS repair method. In both instances bits with failing U-terms were repaired using a 3-bit global replacement. Referring to FIG. 14, line 1402 illustrates the P-margins for each block or block of the unrepaired memory device. Line 1404 illustrates the P-margins for each block or block of the same memory device repaired using the global repair method, and line 1406 illustrates the P-margins for each block or block of the memory device repaired using the LVS repair method. The resulting average P-margin, minimum P-margin, maximum P-margin and margin of the memory device are shown in Table 3 below. It is noted that all values in Table 3 are given in $V_{REF}$ units of the local reference voltage. It is further noted that the margin of the memory device is determined by and determined by and substantially equal to the most limiting P-margin of a block in the memory device—minimum P-margin. Referring to FIG. 14 it is seen that by applying LVS repair method, under-repaired segments (indicated by P-terms 1408) is eliminated and over repair (indicated by P-terms 1410) is substantially minimized. Referring to Table 3 it is seen that the P-margin of the memory device repaired using the LVS repair method is improved 11% (from 44 to 49 $V_{REF}$ units) as compared to global repair method.

TABLE 3

| | P-Margin following Global Repair | P-Margin following LVS Repair |
|---|---|---|
| Average | 49 | 49 |
| Maximum | 55 | 54 |
| Minimum | 44 | 49 |
| Margin of Device | 44 | 49 |

A method of performing an LVS repair of a 1T1C F-RAM by executing an n-step P-margin binary search independently in each block or segment will now be described. In this method each step of the n-step P-margin binary search will be performed in all segments before moving to the next step. A final repair solution will be obtained at the final step that there is no under repaired segments, over repair of the segments is minimized.

Prior to performing repair the LVS repair, the following three values must be determined:
1. A highest U-term (U0) of each segment. This value will be used as a starting point for each LVS during repair and will be used to calculate P-margin.
2. A predefined minimum 1T1C margin limit (P0-U0). This is based on reliability and yield evaluation. If there is no repair solution found for certain parts, those parts will be rejected. The minimal 1T1C margin (P0-U0) limit will guarantee the reliability of passing parts.
3. A pre-defined P-margin search range. This is based on statistics of P-margin distribution of the device to include 6 sigma of the distribution. The search range will determine the number of search steps. For example, performing a binary search of a search range of $2^5$ or 32 and $2^6$ or 64 Units of $V_{REF}$ will require search steps of 5 and 6, respectively.

Generally, the repair search will start from a $V_{REF}$=U0+margin limit+first interval of N step binary search. The first interval will be the mid-point of the binary search range. At each interval, repair will be attempted for all segments. A given interval is considered repairable only if all segments are repairable. A 5-step binary search will be used for illustration purposes below. In this example, the following values are used for U0 for an 8-segment device:

| LVS | U0 |
|---|---|
| 0 | 48 |
| 1 | 44 |
| 2 | 37 |
| 3 | 40 |
| 4 | 45 |
| 5 | 51 |
| 6 | 48 |
| 7 | 36 |

The 1T1C margin limit (P0-U0) is predefined or set at 32 $V_{REF}$ units, and the binary search range is set at 32 $V_{REF}$ units. Thus, this example requires a 5-step binary search. Repair for each segment at a $V_{REF}$=U0+32 will be attempted in the first interval. If successful, the second interval will be calculated by adding 8 to the first interval. If unsuccessful, the second interval will be calculated by subtracting 8 from the first interval.

Repair for each LVS at $V_{REF}$=U0+32+the second interval will be attempted. If successful, the third interval will be calculated by adding 4 to the second interval. If unsuccessful, the third interval will be calculated by subtracting 4 from the second interval. The sequence will continue for two more intervals: +/−2 and +/−1. The repair solution that was determined at the highest repairable $V_{REF}$ will be stored in the device.

Embodiments of the present invention have been described above with the aid of functional and schematic block diagrams illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

It is to be understood that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The breadth and scope of the present invention should not be limited by any of the above-described exemplary embodiments, but should be defined only in accordance with the following claims and their equivalents.

What is claimed is:

1. A ferroelectric random access memory (F-RAM) device comprising:
an array of F-RAM cells arranged in a plurality of rows each row sharing a wordline and plateline, and in a plurality of columns each column sharing a bitline, the array divided into a plurality of blocks based on row and column addresses of F-RAM cells in each of the plurality of blocks; and
a sensing circuit including at least one comparator having a first input coupled to a bitline of one of the plurality of the blocks being read to receive memory signals therefrom, and a charge sharing element coupled through at least one switching circuit to a second input of the comparator, wherein the charge sharing element is further coupled to a local reference voltage generator to receive a reference voltage based on an address to the one of the plurality of the blocks being read, wherein the reference voltage generator comprises base reference voltage generation circuit to provide a base voltage, and an adjustment reference voltage generation circuit to provide an adjustment voltage based on which one of the plurality of blocks is being read to offset the base voltage to generate the reference voltage provided to the sensing circuit.

2. The F-RAM device of claim 1 wherein the F-RAM cells comprise one-transistor, one-capacitor (1T1C) F-RAM cells, and wherein the reference voltage is selected based on a lowest program-term (P0) or highest erase-term (U0) of the F-RAM cells in the one of the plurality of blocks being read.

3. The F-RAM device of claim 1 further comprising control circuits coupled to the reference voltage generator, wherein the control circuits comprise configuration circuits to control the base reference voltage generation circuit, and adjustment control circuits to control the adjustment reference voltage generation circuit.

4. The F-RAM device of claim 3 further comprising a supervisory memory coupled to the adjustment reference voltage generation circuit, the supervisory memory including one or more lookup tables storing information to enable the adjustment reference voltage generation circuit to be operated to provide the adjustment voltage based on which one of the plurality of blocks is being read.

5. The F-RAM device of claim 4 wherein the base reference voltage generation circuit comprises a first array of capacitors one or more of which can be coupled to transfer charge to the charge sharing element in the sensing circuit to provide the base voltage thereto, and the adjustment reference voltage generation circuit comprises a second array of capacitors one or more of which can be coupled to transfer charge to the charge sharing element to offset the base voltage to generate the reference voltage provided to the sensing circuit.

6. A system comprising:
an array of non-volatile memory (NVM) cells divided into a plurality of blocks;
a sensing circuit coupled to the array to receive memory signals therefrom and to compare the memory signals to reference voltages to read data from the NVM cells; and
a reference voltage generator coupled to the sensing circuit to provide reference voltages thereto, the reference voltage generator configured to provide one of a number of reference voltages to the sensing circuit based on which one of the plurality of blocks is being read;
wherein the NVM cells comprise one-transistor, one-capacitor (1T1C) memory cells, and wherein the one of the number of reference voltages is selected based on a lowest program-term or highest erase-term of the NVM cells in the one of the plurality of blocks being read.

7. The system of claim 6 wherein a first one of number of reference voltages provided to the sensing circuit to read one of the plurality of blocks is different from a second one of number of reference voltages provided to read another one of the plurality of blocks.

8. The system of claim 6 wherein the NVM cells are arranged in a plurality of rows each sharing a wordline, and a plurality of columns each sharing a bitline, and the array is logically divided into the plurality of blocks based on row and column addresses of NVM cells in each of the plurality of blocks, and wherein the reference voltage generator is configured to provide one of the number of reference voltages to the sensing circuit based on the row and column addresses of NVM cells in each of the plurality of blocks.

9. The system of claim 6 wherein the reference voltage generator comprises base reference voltage generation circuit to provide a base voltage, and an adjustment reference voltage generation circuit to provide an adjustment voltage based on which one of the plurality of blocks is being read to offset the base voltage to generate the one of the number of reference voltages provided to the sensing circuit.

10. The system of claim 9 further comprising control circuits coupled to the reference voltage generator, wherein the control circuits comprise configuration circuits to control the base reference voltage generation circuit, and adjustment control circuits to control the adjustment reference voltage generation circuit.

11. The system of claim 10 further comprising a supervisory memory coupled to the adjustment reference voltage generation circuit, the supervisory memory including one or more lookup tables storing information to enable the adjustment reference voltage generation circuit to be operated to provide the adjustment voltage based on which one of the plurality of blocks is being read.

12. The system of claim 11 wherein the NVM cells are arranged in a plurality of rows each sharing a wordline and, and a plurality of columns each sharing a bitline, and the array is logically divided into the plurality of blocks based on row and column addresses of NVM cells in each of the plurality of blocks, and further comprising an address buffer coupled to the adjustment reference voltage generation circuit to identify which one of the plurality of blocks is being read.

13. The system of claim 9 wherein the base reference voltage generation circuit comprises a first array of capacitors one or more of which can be coupled to transfer charge to a staging capacitor in the sensing circuit to provide the base voltage thereto, and the adjustment reference voltage generation circuit comprises a second array of capacitors one or more of which can be coupled to transfer charge to the staging capacitor to offset the base voltage to generate the one of the number of reference voltages provided to the sensing circuit.

14. A system comprising:
- an array of non-volatile memory (NVM) cells divided into a plurality of blocks;
- a sensing circuit coupled to the array to receive memory signals therefrom and to compare the memory signals to reference voltages to read data from the NVM cells; and
- a reference voltage generator coupled to the sensing circuit to provide reference voltages thereto, the reference voltage generator configured to provide one of a number of reference voltages to the sensing circuit based on which one of the plurality of blocks is being read, wherein the reference voltage generator comprises base reference voltage generation circuit to provide a base voltage, and an adjustment reference voltage generation circuit to provide an adjustment voltage based on which one of the plurality of blocks is being read to offset the base voltage to generate the one of the number of reference voltages provided to the sensing circuit.

* * * * *